US 9,276,565 B2

(12) United States Patent
Tomita et al.

(10) Patent No.: US 9,276,565 B2
(45) Date of Patent: Mar. 1, 2016

(54) DUTY RATIO CORRECTION CIRCUIT AND PHASE SYNCHRONIZATION CIRCUIT

(71) Applicant: Sony Corporation, Tokyo (JP)

(72) Inventors: Kazutoshi Tomita, Kanagawa (JP); Shingo Harada, Kanagawa (JP); Atsumi Niwa, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 14/566,837

(22) Filed: Dec. 11, 2014

(65) Prior Publication Data

US 2015/0214932 A1  Jul. 30, 2015

(30) Foreign Application Priority Data

Jan. 24, 2014  (JP) ................................. 2014-011748

(51) Int. Cl.
| | |
|---|---|
| H03L 7/06 | (2006.01) |
| H03K 3/017 | (2006.01) |
| H03L 7/08 | (2006.01) |
| H03K 5/156 | (2006.01) |

(52) U.S. Cl.
CPC .............. *H03K 3/017* (2013.01); *H03K 5/1565* (2013.01); *H03L 7/08* (2013.01)

(58) Field of Classification Search
USPC .................. 327/147–149, 156–158
See application file for complete search history.

(56) References Cited

U.S. PATENT DOCUMENTS

| | | | | |
|---|---|---|---|---|
| 5,404,180 A | * | 4/1995 | Kitano ..................... | H03K 5/12 348/625 |
| 8,947,141 B2 | * | 2/2015 | Willey ...................... | H03L 7/06 327/149 |
| 2012/0154001 A1 | * | 6/2012 | Seo ......................... | H03L 7/0814 327/158 |
| 2014/0320095 A1 | * | 10/2014 | Sambucco ............... | G05F 1/46 323/271 |
| 2015/0097603 A1 | * | 4/2015 | Amirkhany ............. | H03K 5/1565 327/155 |
| 2015/0214932 A1 | * | 7/2015 | Tomita .................... | H03K 3/017 327/156 |
| 2015/0263676 A1 | * | 9/2015 | Lu .......................... | H03F 1/0233 330/260 |

FOREIGN PATENT DOCUMENTS

JP  11-243327  9/1999

* cited by examiner

*Primary Examiner* — Adam Houston
(74) *Attorney, Agent, or Firm* — Michael Best & Friedrich LLP

(57) ABSTRACT

A duty ratio correction circuit includes: a buffer circuit configured to generate a second signal based on a first signal, the second signal having a DC component corresponding to a first control signal; a waveform shaping section configured to shape a waveform of the second signal to generate a third signal that is a target of duty ratio correction; a first capacitor; and a first charge-discharge control circuit configured to selectively charge or discharge the first capacitor based on the third signal, to generate the first control signal.

8 Claims, 18 Drawing Sheets

DUTY RATIO CORRECTION CIRCUIT AND PHASE SYNCHRONIZATION CIRCUIT

CROSS REFERENCE TO RELATED APPLICATIONS

This application claims the benefit of Japanese Priority Patent Application JP 2014-011748 filed Jan. 24, 2014, the entire contents of which are incorporated herein by reference.

BACKGROUND

The present disclosure relates to a duty ratio correction circuit adjusting a duty ratio of a signal, and to a phase synchronization circuit provided with such a duty ratio correction circuit.

In an electronic circuit, a clock signal is often used. Typically, a duty ratio of the clock signal may be desirably about 50%; however, for example, the duty ratio may deviated from about 50% due to characteristics of a buffer circuit, a load, or the like. In such a case, a duty ratio correction circuit correcting the duty ratio is often used.

Various technologies about such a duty ratio correction circuit have been disclosed. For example, in Japanese Unexamined Patent Application Publication No. H11-243327, a circuit that acquires a DC level of a clock signal with use of a low pass filter and performs negative feedback control of a rise time and a fall time of the clock signal so that the DC level becomes about half of a source voltage has been disclosed.

SUMMARY

Incidentally, typically, it is desired for an electronic apparatus to reduce consumed power, and reduction of the consumed power is expected also in an electronic circuit.

It is desirable to provide a duty ratio correction circuit and a phase synchronization circuit that are capable of reducing consumed power.

According to an embodiment of the disclosure, there is provided a duty ratio correction circuit including: a buffer circuit configured to generate a second signal based on a first signal, the second signal having a DC component corresponding to a first control signal; a waveform shaping section configured to shape a waveform of the second signal to generate a third signal that is a target of duty ratio correction; a first capacitor; and a first charge-discharge control circuit configured to selectively charge or discharge the first capacitor based on the third signal, to generate the first control signal.

According to an embodiment of the disclosure, there is provided a phase synchronization circuit including: a phase comparison circuit configured to compare a phase of an input clock signal with a phase of a feedback clock signal; an oscillation circuit configured to generate a first signal based on a comparison result of the phase comparison circuit; a frequency dividing circuit configured to divide a frequency of the first signal to generate the feedback clock signal; and a duty ratio correction circuit configured to operate based on the first signal. The duty ratio correction circuit includes a buffer circuit configured to generate a second signal based on the first signal, the second signal having a DC component corresponding to a first control signal, a waveform shaping section configured to shape a waveform of the second signal to generate a third signal that is a target of duty ratio correction, a first capacitor, and a first charge-discharge control circuit configured to selectively charge or discharge the first capacitor based on the third signal, to generate the first control signal.

In the duty ratio correction circuit and the phase synchronization circuit according to the respective embodiments of the disclosure, the second signal having the DC component corresponding to the first control signal is generated based on the first signal, a waveform of the second signal is shaped, and accordingly the third signal is generated. Further, the first capacitor is selectively charged or discharged based on the third signal, and thus the first control signal is generated.

In the duty ratio correction circuit and the phase synchronization circuit according to the respective embodiments of the disclosure, the first capacitor is selectively charged or discharged based on the third signal, to generate the first control signal. Therefore, it is possible to reduce consumed power. Incidentally, effects described here are non-limiting. Effects achieved by the technology may be one or more of effects described in the present disclosure.

It is to be understood that both the foregoing general description and the following detailed description are exemplary, and are intended to provide further explanation of the technology as claimed.

BRIEF DESCRIPTION OF THE DRAWINGS

The accompanying drawings are included to provide a further understanding of the disclosure, and are incorporated in and constitute a part of this specification. The drawings illustrate embodiments and, together with the specification, serve to explain the principles of the technology.

DETAILED DESCRIPTION

Hereinafter, some embodiments of the disclosure will be described in detail with reference to drawings. Note that description will be given in the following order.
1. First embodiment
2. Second embodiment
3. Application examples
1.<First Embodiment>
(Configuration Example)

Figure 1:
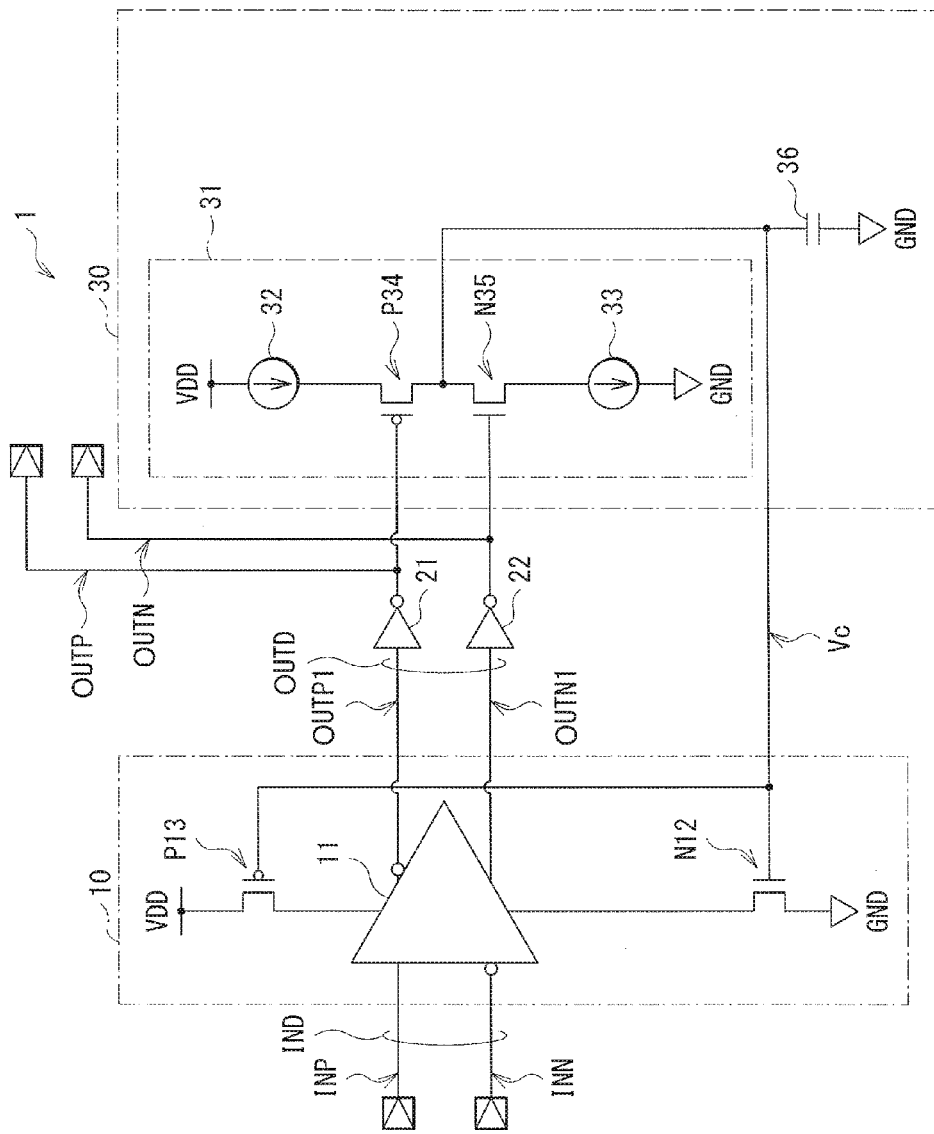
FIG. 1 is a circuit diagram illustrating a configuration example of a duty ratio correction circuit according to a first embodiment of the disclosure.

FIG. 1 illustrates a configuration example of a duty ratio correction circuit according to a first embodiment. A duty ratio correction circuit 1 is a circuit configured to correct a duty ratio through negative feedback control with use of a charge pump. The duty ratio correction circuit 1 includes a buffer circuit 10, inverters 21 and 22, and a duty ratio detection circuit 30.

The buffer circuit 10 generates differential signals OUTD (signals OUTP1 and OUTN1) each having a common mode voltage Vcom2 that corresponds to a control voltage Vc, based on differential signals IND (signals INP and INN).

Figure 2:
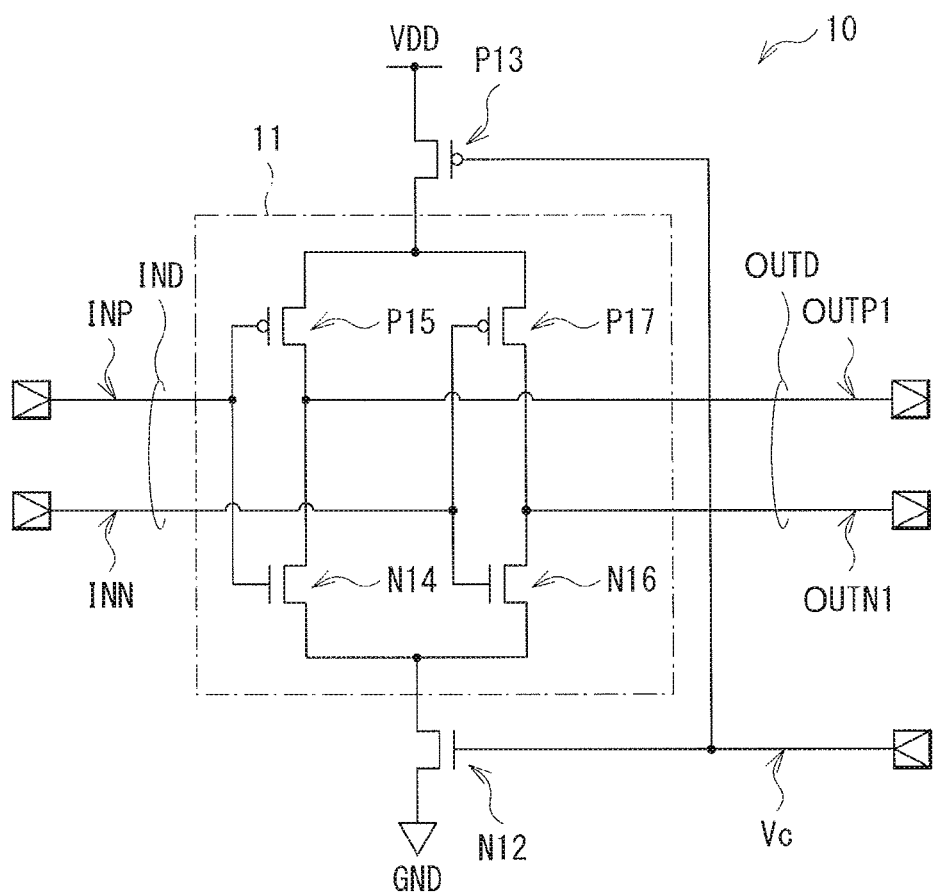
FIG. 2 is a circuit diagram illustrating a configuration example of a buffer circuit illustrated in FIG. 1.

FIG. 2 illustrates a configuration example of the buffer circuit 10. The buffer circuit 10 includes a buffer section 11, a transistor N12, and a transistor P13. The buffer section 11 includes transistors N14, P15, N16, and P17.

Each of the transistors N12, N14, and N16 is an N-type metal oxide semiconductor field effect transistor (MOSFET). Each of the transistors P13, P15, and P17 is a P-type MOSFET. A gate of the transistor N12 is supplied with the control voltage Vc, a drain thereof is connected to a source of each of the transistors N14 and N16, and a source thereof is grounded. A gate of the transistor P13 is supplied with the control voltage Vc, a drain thereof is connected to a source of each of the transistors P15 and P17, and a source thereof is supplied with a source voltage VDD. A gate of the transistor N14 is connected to a gate of the transistor P15 and is supplied with the signal INP, a drain thereof is connected to a drain of the transistor P15, and the source thereof is connected to the source of the transistor N16 and the drain of the transistor N12. The gate of the transistor P15 is connected to the gate of the transistor N14 and is supplied with the signal INP, the drain thereof is connected to the drain of the transistor N14, and the source thereof is connected to the source of the transistor P17 and the drain of the transistor P13. A gate of the transistor N16 is connected to a gate of the transistor P17 and is supplied with the signal INN, a drain thereof is connected to a drain of the transistor P17, and the source thereof is connected to the source of the transistor N14 and the drain of the transistor N12. The gate of the transistor P17 is connected to the gate of the transistor N16 and is supplied with the signal INN, the drain thereof is connected to the drain of the transistor N16, and the source thereof is connected to the source of the transistor P15 and the drain of the transistor P13.

With this configuration, the transistors N14 and P15 each invert the signal INP to generate the signal OUTP1, and the transistors N16 and P17 each invert the signal INN to generate the signal OUTN1. At this time, the transistors N12 and P13 each adjust the common mode voltage Vcom2 of the signals OUTP1 and OUTN1, respectively. Specifically, for example, when a voltage level of the control voltage Vc is high, a drain-source resistance of the transistor N12 is decreased and a drain-source resistance of the transistor P13 is increased. Accordingly, the driving force of the transistor N12 is increased and the driving force of the transistor P13 is decreased, and as a result, the common mode voltage Vcom2 of the signals OUTP1 and OUTN1 becomes low. Moreover, for example, when the voltage level of the control voltage Vc is low, the drain-source resistance of the transistor N12 is increased, and the drain-source resistance of the transistor P13 is decreased. Accordingly, the driving force of the transistor N12 is decreased and the driving force of the transistor P13 is increased, and as a result, the common mode voltage Vcom2 of the signals OUTP1 and OUTN1 becomes high. In this way, the buffer circuit 10 generates the signals OUTP1 and OUTN1 each having the common mode voltage Vcom2 corresponding to the control voltage Vc, based on the signals INP and INN.

Incidentally, slew rates of the signals INP and INN may be desirably low. Specifically, for example, in the case where the slew rates of the signals INP and INN are high, the driving force of the transistor N12 may be not sufficiently increased even at high control voltage Vc, and the driving force of the transistor P13 may be not sufficiently increased even at low control voltage Vc. In such a case, the common mode voltage Vcom2 is difficult to vary even when the control voltage Vc is varied. Therefore, the slew rates of the signals INP and INN may be desirably low to allow the common voltage Vcom2 to be easily varied.

The inverter 21 inverts and amplifies the signal OUTP1 that is an analog signal, based on a logical threshold voltage Vlogic, and generates a signal OUTP that is a digital signal transitioning between the source voltage VDD (high level) and the ground voltage GND (low level). The inverter 22 inverts and amplifies the signal OUTN1 that is an analog signal, based on the logical threshold voltage Vlogic, and generates a signal OUTN that is a digital signal transitioning between the source voltage VDD (high level) and the ground voltage GND (low level). The logical threshold voltage Vlogic of the inverters 21 and 22 is set to a voltage half of the source voltage VDD (VDD/2) in this example. Note that the logical threshold voltage Vlogic is not limited thereto, and may be shifted from the voltage half of the source voltage VDD (VDD/2).

The duty ratio detection circuit 30 generates the control voltage Vc based on the signals OUTP and OUTN. The duty ratio detection circuit 30 includes a charge pump 31 and a capacitor 36.

The charge pump 31 includes transistors P34 and N35 and current sources 32 and 33. The transistor P34 is a P-type MOSFET, and the transistor N35 is an N-type MOSFET. A gate of the transistor P34 is connected to an output terminal of the inverter 21 and is supplied with the signal OUTP, a drain thereof is connected to a drain of the transistor N35, a first end of the capacitor 36, and the gates of the transistors N12 and P13 of the buffer circuit 10, and a source thereof is connected to a first end of the current source 32. A gate of the transistor N35 is connected to an output terminal of the inverter 22 and is supplied with the signal OUTN, a drain thereof is connected to the drain of the transistor P34, the first end of the capacitor 36, and the gates of the transistors N12 and P13 of the buffer circuit 10, and a source thereof is connected to a first end of the current source 33. The current source 32 is a circuit generating a current Ip that is allowed to flow through the capacitor 36, and the first end thereof is connected to the source of the transistor P34, and a second end thereof is supplied with the source voltage VDD. The current source 33 is a circuit generating a current In that is sunk from the capacitor 36, and the first end thereof is connected to the source of the transistor N35, and a second end thereof is grounded. In this example, the current sources 32 and 33 are configured such that the current Ip and the current In are equivalent to each other.

The first end of the capacitor 36 is connected to the drains of the transistors P34 and N35 and the gates of the transistors N12 and P13 of the buffer circuit 10, and a second end thereof is grounded.

With this configuration, in the duty ratio detection circuit 30, when the signal OUTP is at low level, the transistor P34 is turned on, and the current source 32 allows the current Ip to flow through the capacitor 36. Moreover, when the signal OUTN is at high level, the transistor N35 is turned on and the current source 33 sinks the current In from the capacitor 36. Then, the duty ratio detection circuit 30 supplies a voltage of the first end of the capacitor 36 to the buffer circuit 10, as the control voltage Vc.

In this way, in the duty ratio correction circuit 1, the buffer circuit 10 generates the differential signals OUTD (the signals OUTP1 and OUTN1) having the common mode voltage Vcom2 corresponding to the control voltage Vc, based on the differential signals IND (the signals INP and INN), and the inverters 21 and 22 generate the signals OUTP and OUTN based on the signals OUTP1 and OUTN1, respectively. Then, the duty ratio detection circuit 30 generates the control voltage Vc based on the signals OUTP and OUTN. As a result, in the duty ratio correction circuit 1, negative feedback control is performed so that the duty ratio of each of the signals OUTP and OUTN becomes about 50%, as will be described later.

Here, the signals INP and INN correspond to a specific but non-limiting example of "first signal" in the disclosure. The signals OUTP1 and OUTN1 correspond to a specific but non-limiting example of "second signal" in the disclosure. The signals OUTP and OUTN correspond to a specific but non-limiting example of "third signal" in the disclosure. The inverters 21 and 22 correspond to a specific but non-limiting example of "waveform shaping section" in the disclosure. The transistors P34 and N35 correspond to a specific but non-limiting example of "first charge-discharge control circuit" in the disclosure. The current source 32 corresponds to a specific but non-limiting example of "first current source" in the disclosure. The current source 33 corresponds to a specific but non-limiting example of "second current source" in the disclosure.

(Operation and Function)

Subsequently, operation and function of the duty ratio correction circuit 1 of the first embodiment will be described.

(General Operation Outline)

First, general operation outline of the duty ratio correction circuit 1 is described with reference to FIGS. 1 and 2. The buffer circuit 10 generates the differential signals OUTD (the signals OUTP1 and OUTN1) each having the common mode voltage Vcom2 corresponding to the control voltage Vc, based on the differential signals IND (the signals INP and INN). The inverter 21 inverts and amplifies the signal OUTP1 based on the logical threshold voltage Vlogic to generate the signal OUTP. The inverter 22 inverts and amplifies the signal OUTN1 based on the logical threshold voltage Vlogic to generate the signal OUTN. The duty ratio detection circuit 30 generates the control voltage Vc based on the signals OUTP and OUTN. Specifically, the transistor P34 is turned on when the signal OUTP is at low level, and the current source 32 allows the current Ip to flow through the capacitor 36. Moreover, the transistor N35 is turned on when the signal OUTN is at high level, and the current source 33 sinks the current In from the capacitor 36. The duty ratio detection circuit 30 supplies the voltage of the first end of the capacitor 36 to the buffer circuit 10, as the control voltage Vc.

(Detailed Operation)

Figure 3:
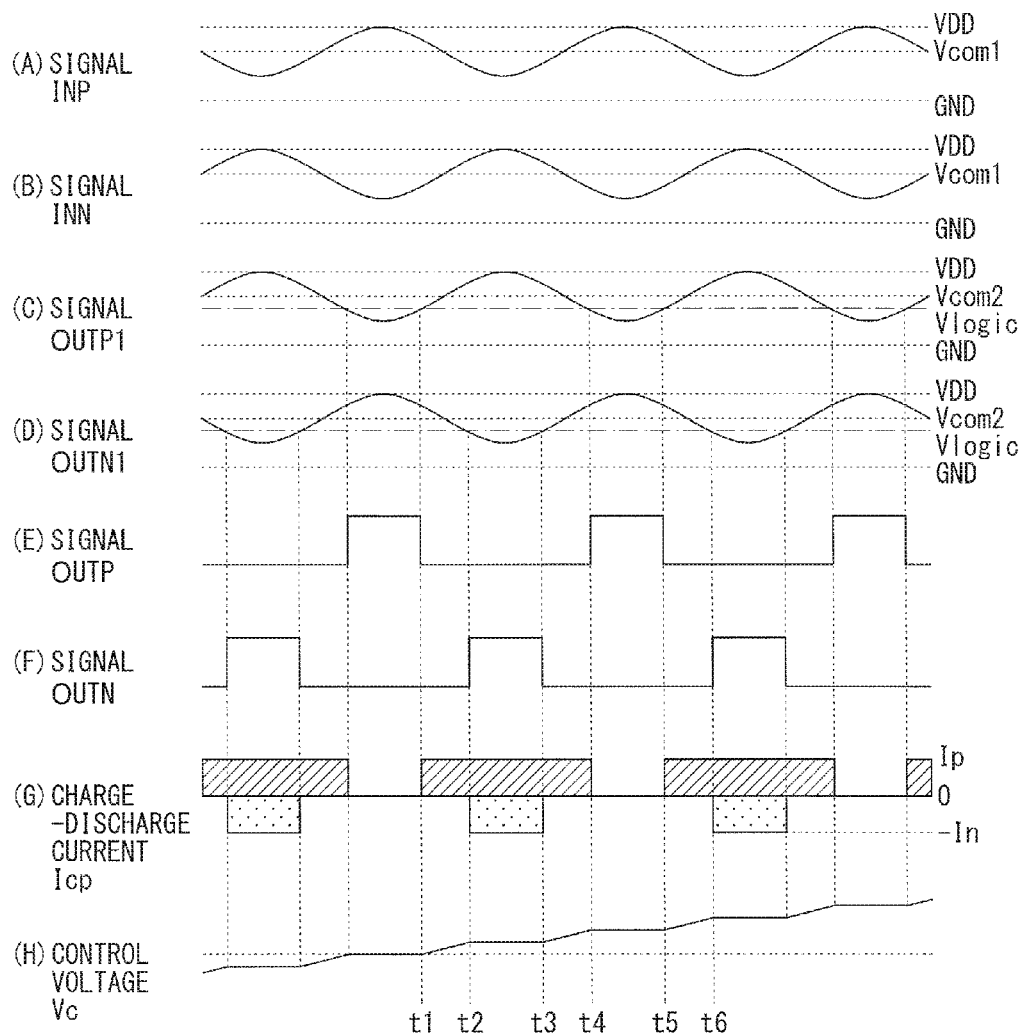
FIG. 3 is a timing waveform chart illustrating an operation example of the duty ratio correction circuit illustrated in FIG. 1.

FIG. 3 illustrates operation when the duty ratio of each of the signals OUTP and OUTN is shifted from about 50%, where (A) illustrates a waveform of the signal INP, (B) illustrates a waveform of the signal INN, (C) illustrates a waveform of the signal OUTP1, (D) illustrates a waveform of the signal OUTN1, (E) illustrates a waveform of the signal OUTP, (F) illustrates a waveform of the signal OUTN, (G) illustrates a waveform of a charge-discharge current Icp to the capacitor 36, and (H) illustrates a waveform of the control voltage Vc.

In this example, the differential signals IND (the signals INP and INN) each having a common mode voltage Vcom1 that is slightly higher than the voltage half of the source voltage VDD (VDD/2) are supplied from a preceding circuit ((A) and (B) of FIG. 3). Then, the buffer circuit 10 generates the differential signals OUTD (the signals OUTP1 and OUTN1) each having the common mode voltage Vcom2 that is slightly higher than the voltage half of the source voltage VDD (VDD/2), based on such differential signals IND (the signals INP and INN) ((C) and (D) of FIG. 3). The inverter 21 inverts and amplified the signal OUTP1 based on the logical threshold voltage Vlogic, to generate the signal OUTP ((E) of FIG. 3). The inverter 22 inverts and amplifies the signal OUTN1 based on the logical threshold voltage Vlogic, to generate the signal OUTN ((F) of FIG. 3). At this time, the duty ratio of each of the signals OUTP and OUTN is lower than about 50%. In other words, in this example, the duty ratio of each of the signals OUTP and OUTN is lower than about 50% because the common mode voltage Vcom2 of the differential signals OUTD (the signals OUTP1 and OUTN1) is higher than the logical threshold voltage Vlogic of the inverters 21 and 22.

The transistor P34 is turned on during a period in which the signal OUTP is at low level (for example, a period from a timing t1 to a timing t4), and is turned off during a period in which the signal OUTP is at high level (for example, a period from the timing t4 to a timing t5). As a result, the capacitor 36 is charged with the current Ip during the period in which the signal OUTP is at low level (for example, the period from the timing t1 to the timing t4) ((G) of FIG. 3). Further, the transistor N35 is turned on during a period in which the signal OUTN is at high level (for example, a period from a timing t2 to a timing t3), and is turned off during a period in which the signal OUTN is at low level (for example, a period from the timing t3 to a timing t6). As a result, the capacitor 36 is discharged by the current In during the period in which the signal OUTN is at high level (for example, the period from the timing t2 to the timing t3) ((G) of FIG. 3). At that time, the period in which the capacitor 36 is charged with the current Ip is longer than the period in which the capacitor 36 is discharged by the current In. Therefore, the charge amount of the capacitor 36 is larger than the discharge amount, and the control voltage Vc gradually increases ((H) of FIG. 3).

The buffer circuit 10 gradually decreases the common mode voltage Vcom2 of the signals OUTP1 and OUTN1 in response to a gradual increase of the control voltage Vc. Specifically, the drain-source resistance of the transistor N12 gradually decreases and the drain-source resistance of the transistor P13 gradually increases as the control voltage Vc increases. As a result, the driving force of the transistor N12 increases and the driving force of the transistor P13 decreases, and in response thereto, the common mode voltage Vcom2 of the signals OUTP1 and OUTN1 gradually decreases. As a result, the duty ratio of each of the signals OUTP and OUTN gradually changes toward about 50%.

In the above-described example, the case where the common mode voltage Vcom2 of the signals OUTP1 and OUTN1 is higher than the logical threshold voltage Vlogic of the inverters 21 and 22 has been described. On the other hand, when the common mode voltage Vcom2 of the signals OUTP1 and OUTN1 is lower than the logical threshold voltage Vlogic, the duty ratio of each of the signals OUTP and OUTN is higher than about 50%. In this case, since the discharge amount is larger than the charge amount in the capacitor 36, the control voltage Vc gradually decreases, and in response thereto, the common mode voltage Vcom2 of the signals OUTP1 and OUTN1 gradually increases. As a result, the duty ratio of each of the signals OUTP and OUTN gradually changes toward about 50%.

In this way, in the duty ratio correction circuit 1, in the case where the common mode voltage Vcom2 of the signals OUTP1 and OUTN1 is higher than the logical threshold voltage Vlogic, the control is performed such that the control voltage Vc is made higher to decrease the common mode voltage Vcom2 of the signals OUTP1 and OUTN1. In addition, in the case where the common mode voltage Vcom2 of the signals OUTP1 and OUTN1 is lower than the logical threshold voltage Vlogic, the control is performed such that the control voltage Vc is made lower to increase the common mode voltage Vcom2. With such negative feedback operation, the common mode voltage Vcom2 of the signals OUTP1 and OUTN1 becomes about the logical threshold voltage Vlogic, and the duty ratio of each of the signals OUTP and OUTN converges on about 50%.

Figure 4:
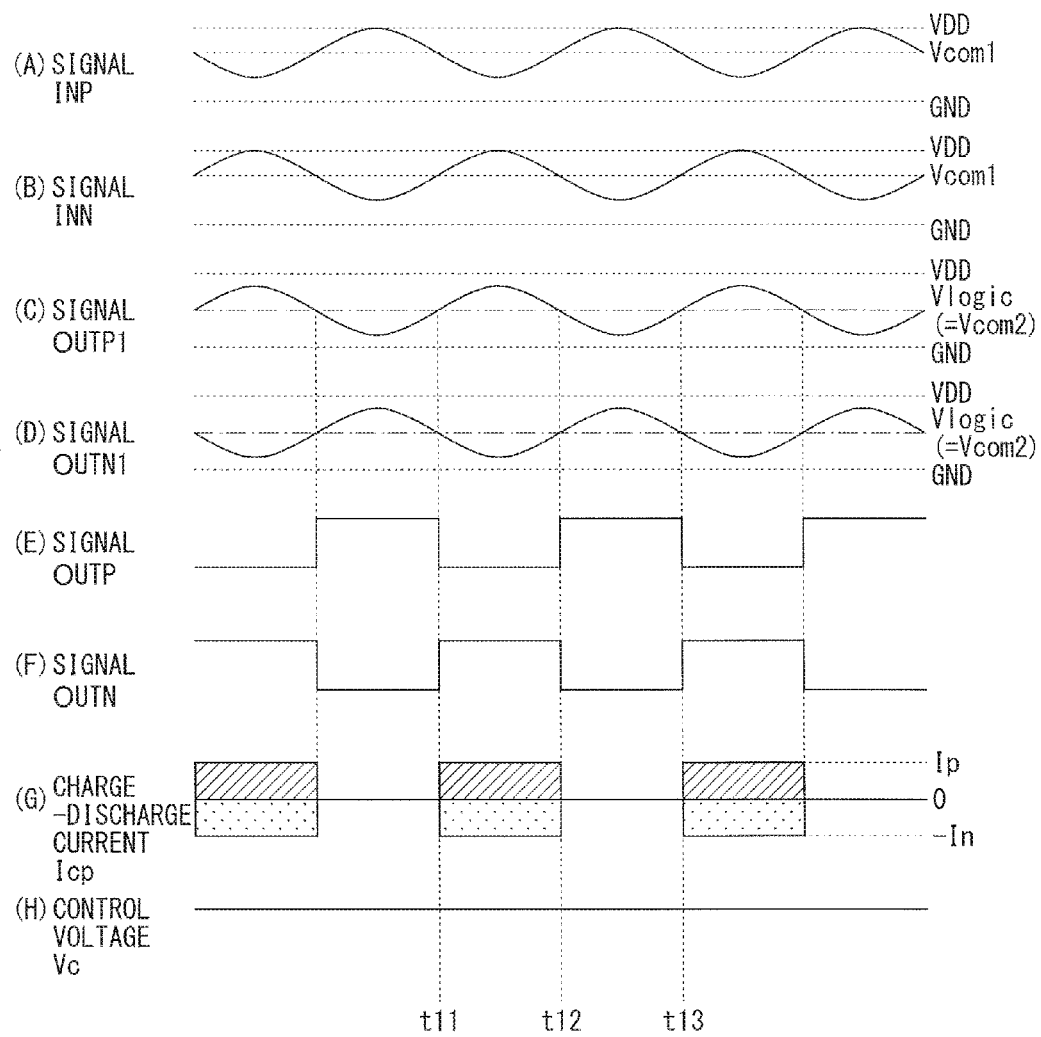
FIG. 4 is a timing waveform chart illustrating another operation example of the duty ratio correction circuit illustrated in FIG. 1.

FIG. 4 illustrates operation when the duty ratio of each of the signals OUTP and OUTN converges on about 50%, where (A) illustrates a waveform of the signal INP, (B) illustrates a waveform of the signal INN, (C) illustrates a waveform of the signal OUTP1, (D) illustrates a waveform of the signal OUTN1, (E) illustrates a waveform of the signal OUTP, (F) illustrates a waveform of the signal OUTN, (G) illustrates a waveform of the charge-discharge current Icp to the capacitor 36, and (H) illustrates a waveform of the control voltage Vc.

The buffer circuit 10 generates the signals OUTP1 and OUTN1 each having the common mode voltage Vcom2 substantially equal to the logical threshold voltage Vlogic, based on the control voltage Vc ((C) and (D) of FIG. 4). Then, the inverters 21 and 22 generate the signals OUTP and OUTN based on the signals OUTP1 and OUTN1, respectively ((E) and (F) of FIG. 4). The transistor P34 is turned on during a period in which the signal OUTP is at low level (for example, a period from a timing t11 to a timing t12), and the capacitor 36 is charged with the current Ip during the period ((G) of FIG. 4). Likewise, the transistor N35 is turned on during a period in which the signal OUTN is at high level (for example, the period from the timing t11 to the timing t12), and the capacitor 36 is discharged by the current In during the period ((G) of FIG. 4). At this time, the length of the period where the capacitor 36 is charged with the current Ip is equivalent to the length of the period where the capacitor 36 is discharged by the current In. Therefore, the charge amount and the discharge amount are balanced in the capacitor 36, and the control voltage Vc is maintained ((H) of FIG. 4). In other words, the common mode voltage Vcom2 of the signals OUTP1 and OUTN1 is set such that the charge amount and the discharge amount are balanced in the capacitor 36. In this way, in the duty ratio correction circuit 1, the duty ratio of each of the signals OUTP and OUTN is allowed to be about 50%.

As described above, in the duty ratio correction circuit 1, the control voltage Vc is generated by the charge pump 31. Therefore, unlike a case of a duty ratio correction circuit 1R according to a comparative example described later, the current does not flows through the duty ratio detection circuit 30 constantly, which makes it possible to reduce consumed power.

Moreover, in the duty ratio correction circuit 1, the charge pump 31 is used. Therefore, as compared with the case of the duty ratio correction circuit 1R according to the comparative example described later, the circuit configuration is allowed to be simplified, and an arrangement area of the circuit is allowed to be decreased.

(Comparative Example)

Next, the duty ratio correction circuit 1R according to the comparative example will be described.

Figure 5:
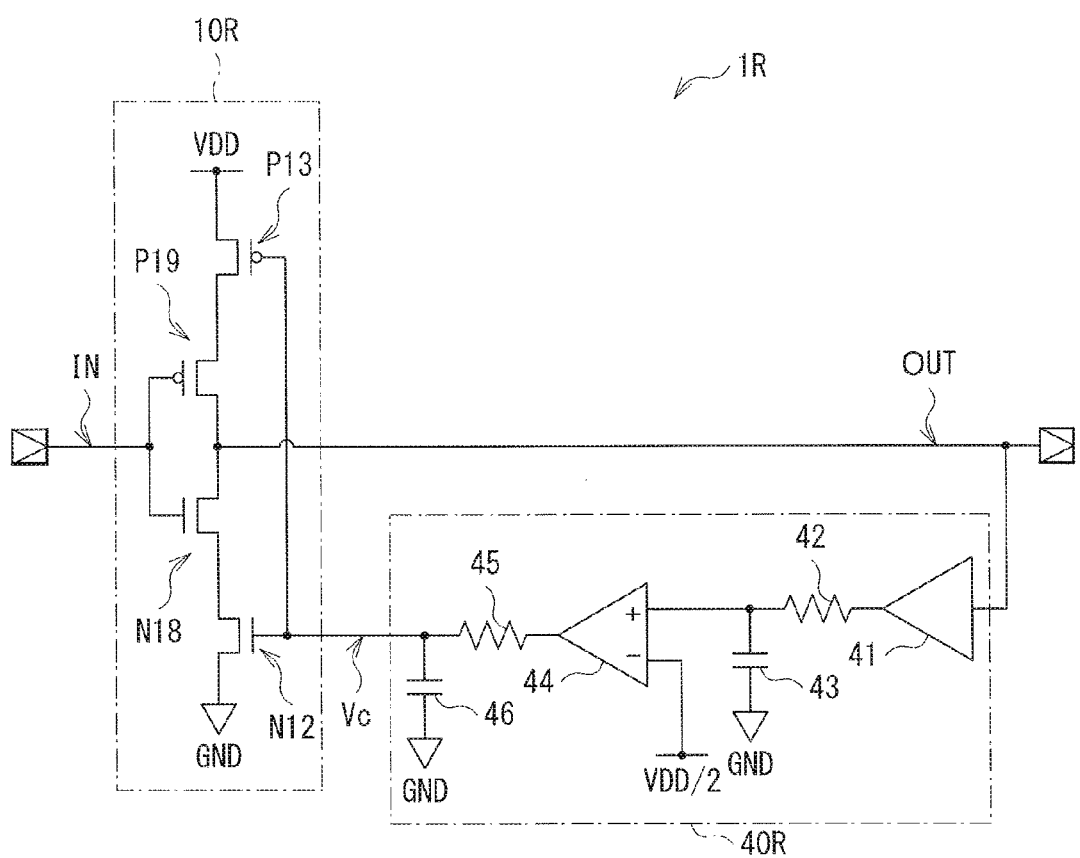
FIG. 5 is a circuit diagram illustrating a configuration example of a duty ratio correction circuit according to a comparative example of the first embodiment.

FIG. 5 illustrates a configuration example of the duty ratio correction circuit 1R according to the comparative example. The duty ratio correction circuit 1R is a circuit similar to the circuit described in Japanese Unexamined Patent Application Publication No. H11-243327. The duty ratio correction circuit 1R includes a buffer circuit 10R and a duty ratio detection circuit 40R.

The buffer circuit 10R generates a signal OUT having a DC level Vdc corresponding to the control voltage Vc, based on a signal IN. The buffer circuit 10R includes transistors N18 and P19. The transistor N18 is an N-type MOSFET, and the transistor P19 is a P-type MOSFET. A gate of the transistor N18 is connected to a gate of the transistor P19 and is supplied with the signal IN, a drain thereof is connected to a drain of the transistor P19, and a source thereof is connected to the drain of the transistor N12. The gate of the transistor P19 is connected to the gate of the transistor N18 and is supplied with the signal IN, the drain thereof is connected to the drain of the transistor N18, and a source thereof is connected to the drain of the transistor P13. With this configuration, the transistors N18 and P19 invert the signal IN to generate the signal OUT. Then, the transistors N12 and P13 adjust the DC level Vdc of the signal OUT, similarly to the case of the first embodiment.

The duty ratio detection circuit 40R generates the control voltage Vc based on the signal OUT. The duty ratio detection circuit 40R includes a buffer 41, a resistor 42, a capacitor 43, a differential amplifier 44, a resistor 45, and a capacitor 46. The buffer 41 is a circuit that shapes the waveform of the signal OUT and outputs the resultant signal. A first end of the resistor 42 is connected to an output terminal of the buffer 41, and a second end thereof is connected to a positive input terminal of the differential amplifier 44 (described later). A first end of the capacitor 43 is connected to the second end of the resistor 42 and the positive input terminal of the differential amplifier 44 (described later), and a second end thereof is grounded. The resistor 42 and the capacitor 43 function as a low-pass filter extracting the DC level of the output signal of the buffer 41. The differential amplifier 44 is a circuit amplifying a voltage difference between a voltage of the positive input terminal and a voltage of a negative input terminal. The positive input terminal of the differential amplifier 44 is connected to the second end of the resistor 42 and the first end of the capacitor 43, and the negative input terminal thereof is supplied with a voltage half of the source voltage VDD (VDD/2). A first end of the resistor 45 is connected to an output terminal of the differential amplifier 44, and a second end thereof is connected to the capacitor 46 and the gates of the respective transistors N12 and P13 of the buffer circuit 10R. A first end of the capacitor 46 is connected to the second end of the resistor 45 and the gates of the respective transistors N12 and P13 of the buffer circuit 10R, and a second end thereof is grounded.

With this configuration, in the duty ratio correction circuit 1R, the negative feedback control is performed so that the duty ratio of the signal OUT becomes about 50%. Specifically, in the duty ratio correction circuit 1R, when the duty ratio of the signal OUT is higher than about 50%, the control voltage Vc is increased to decrease the DC level Vdc of the signal OUT. As a result, the duty ratio of the signal OUT is decreased. Moreover, in the duty ratio correction circuit 1R, when the duty ratio of the signal OUT is lower than about 50%, the control voltage Vc is decreased to increase the DC level Vdc of the signal OUT. As a result, the duty ratio of the signal OUT is increased.

In the duty ratio correction circuit 1R according to the comparative example, since the duty ratio detection circuit 40R is a circuit continuously operating with time, a constant current flows, which may increase consumed power. Moreover, in the duty ratio correction circuit 1R, the differential amplifier 44 amplifies a voltage difference between the DC level of the output signal of the buffer 41 and the voltage half of the source voltage VDD (VDD/2) to perform the negative feedback control so that the DC level becomes about the voltage half of the source voltage VDD. Accordingly, for example, such a differential amplifier 44 may be desired to have sufficiently high gain or sufficiently low input offset voltage in order to enhance accuracy of the duty ratio correction. When the gain is increased sufficiently in this way, for example, the consumed power may become large. Moreover, when the input offset voltage is decreased, for example, an area of the transistor configuring the differential pair of the input stage of the differential amplifier 44 may become large. Further, in the duty ratio correction circuit 1R, the low pass filter configured of the resistor 42 and the capacitor 43 extracts the DC level from the output signal of the buffer 41. Typically, such a resistor 42 has a large resistance value, and such a capacitor 43 has a large capacitance value. Therefore, an arrangement area of the resistor 42 and the capacitor 43 may become large.

On the other hand, in the duty ratio correction circuit 1 according to the first embodiment, the charge pump 31 is provided to allow the currents Ip and In to flow intermittently. Therefore, it is possible to reduce the consumed power as compared with the case where the current constantly flows. In particular, in the duty ratio correction circuit 1, it is possible to reduce the consumed power while maintaining loop response characteristics of the negative feedback operation by setting the currents Ip and In to small values and setting the capacitance value of the capacitor 36 to small.

Moreover, in the duty ratio correction circuit 1, the charge pump 31 is used. Therefore, as compared with the case of the comparative example using the differential amplifier 44, it is possible to simplify the circuit configuration. Moreover, the duty ratio correction circuit 1 does not include a resistor having a large resistance value and a capacitor having a large capacitance value. Therefore, it is possible to reduce the arrangement area of the circuit. In particular, the transistor is downsized according to miniaturization as the generation of the manufacturing process progresses. Accordingly, the arrangement area of the transistors P34 and N35 and the transistors configuring the current sources 33 and 34 are expected to be further decreased.

(Effects)

As described above, in the first embodiment, the charge pump is provided to allow the current to flow intermittently. Therefore, it is possible to reduce the consumed power.

In the first embodiment, the charge pump is provided. Therefore, it is possible to simplify the circuit configuration and to reduce the arrangement area of the circuit.

(Modification 1-1)

In the above-described first embodiment, the buffer circuit 10 handles the differential signal. However, the signal is not limited thereto, and alternatively, for example, the buffer circuit 10 may handle a single-ended signal. A duty ratio correction circuit 2 according to the present modification will be described in detail below.

Figure 6:
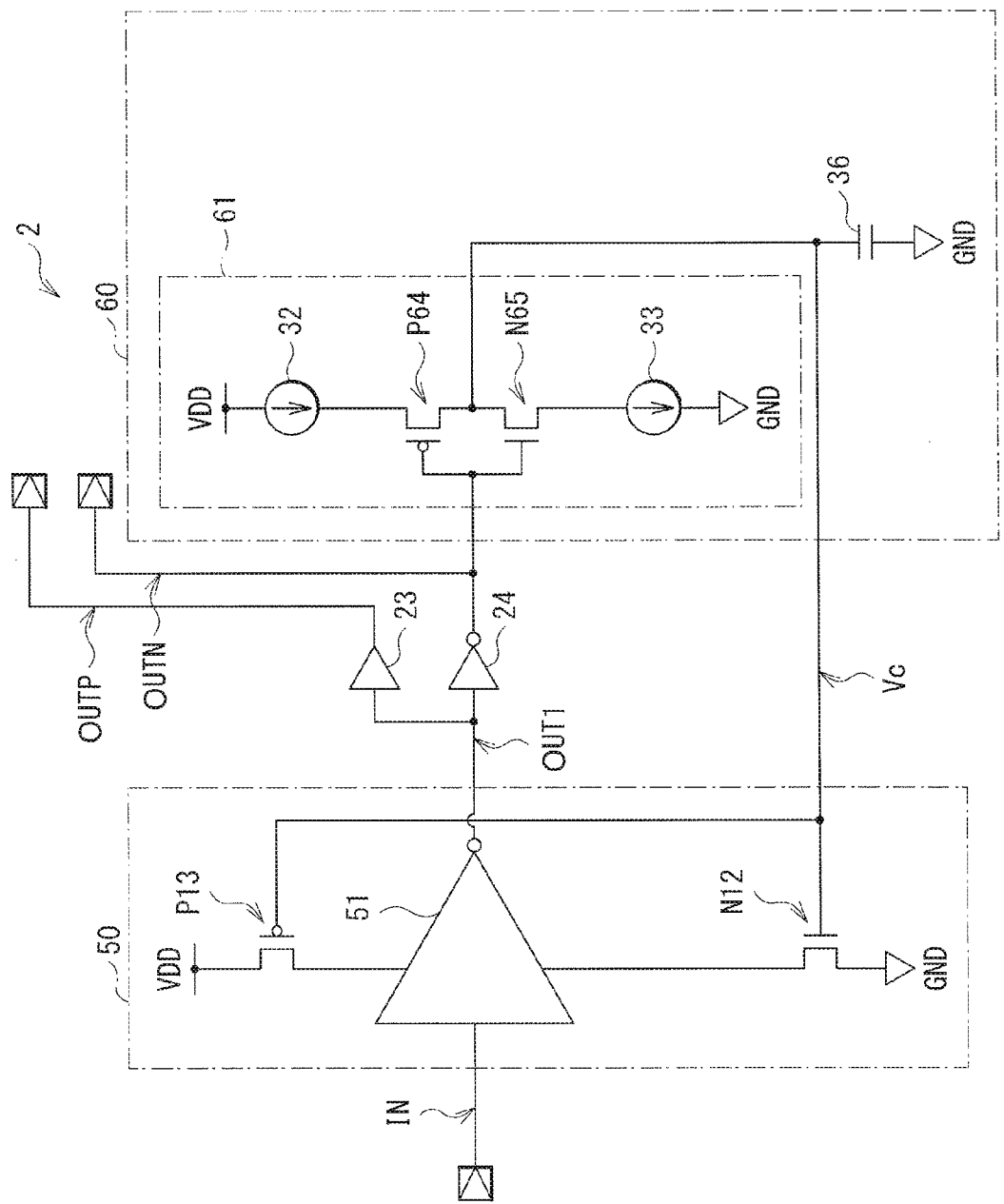
FIG. 6 is a circuit diagram illustrating a configuration example of a duty ratio correction circuit according to a modification of the first embodiment.

FIG. 6 illustrates a configuration example of the duty ratio correction circuit 2. The duty ratio correction circuit 2 includes a buffer circuit 50, a buffer 23, an inverter 24, and a duty ratio detection circuit 60.

The buffer circuit 50 generates a signal OUT1 having a DC level Vdc2 corresponding to the control voltage Vc, based on the signal IN.

Figure 7:
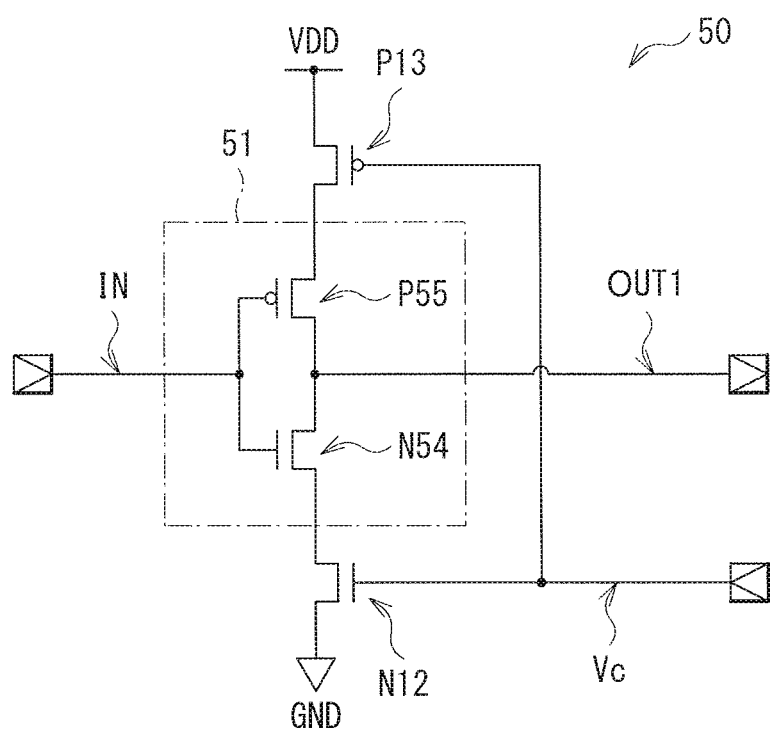
FIG. 7 is a circuit diagram illustrating a configuration example of a buffer circuit illustrated in FIG. 6.

FIG. 7 illustrates a configuration example of the buffer circuit 50. The buffer circuit 50 includes a buffer section 51, the transistor N12, and the transistor P13. The buffer section 51 includes transistors N54 and P55. A gate of the transistor N54 is connected to a gate of the transistor P55 and is supplied with the signal IN, a drain thereof is connected to a drain of the transistor P55, and a source thereof is connected to the drain of the transistor N12. A gate of the transistor P55 is connected to the gate of the transistor N54 and is supplied with the signal IN, the drain thereof is connected to the drain of the transistor N54, and a source thereof is connected to the drain of the transistor P13. With this configuration, the transistors N54 and P55 invert the signal IN to generate the signal OUT1. Further, the transistors N12 and P13 adjust the DC level Vdc2 of the signal OUT1, similarly to the case of the above-described first embodiment.

The buffer 23 amplifies the signal OUT1 that is an analog signal, based on the logical threshold voltage Vlogic, and generates the signal OUTP that is a digital signal transitioning between the source voltage VDD (high level) and the ground voltage GND (low level). The inverter 24 inverts and amplifies the signal OUT1 that is an analog signal, based on the logical threshold voltage Vlogic, and generates the signal OUTN that is a digital signal transitioning between the source voltage VDD (high level) and the ground voltage GND (low level). The logical threshold voltage Vlogic of the buffer 23 and the inverter 24 is set to a voltage half of the source voltage VDD (VDD/2) in this example.

The duty ratio detection circuit 60 generates the control voltage Vc based on the signal OUTN. The duty ratio detection circuit 60 includes a charge pump 61 and the capacitor 36. The charge pump 61 includes transistors P64 and N65, and the current sources 32 and 33. The transistor P64 is a P-type MOSFET, and the transistor N65 is an N-type MOSFET. A gate of the transistor P64 is connected to a gate of the transistor N65 and an output terminal of the inverter 24, and is supplied with the signal OUTN. A drain thereof is connected to a drain of the transistor N65 and the first end of the capacitor 36 and the gates of the respective transistors N12 and P13 of the buffer circuit 50, and a source thereof is connected to the first end of the current source 32. The gate of the transistor N65 is connected to the gate of the transistor P64 and the output terminal of the inverter 24, and is supplies with the signal OUTN. A drain thereof is connected to the drain of the transistor P64 and the first end of the capacitor 36, and is connected to the gates of the respective transistors N12 and P13 of the buffer circuit 50. A source thereof is connected to the first end of the current source 33. With this configuration, in the duty ratio detection circuit 60, when the signal OUTN is at low level, the transistor P64 is turned on, and the current source 32 allows the current Ip to flow through the capacitor 36. Moreover, when the signal OUTN is at high level, the transistor N65 is turned on, and the current source 33 sinks the current In from the capacitor 36. Then, the duty ratio detection circuit 60 supplies the voltage of the first end of the capacitor 36 to the buffer circuit 50, as the control voltage Vc.

Here, the signal IN corresponds to a specific but non-limiting example of "first signal" in the disclosure. The signal OUT1 corresponds to a specific but non-limiting example of "second signal" in the disclosure. The signal OUTN corresponds to a specific but non-limiting example of "third signal" in the disclosure. The inverter 24 corresponds to a specific but non-limiting example of "waveform shaping section" in the disclosure. The transistors P64 and N65 correspond to a specific but non-limiting example of "first charge-discharge control circuit" in the disclosure.

Figure 8:
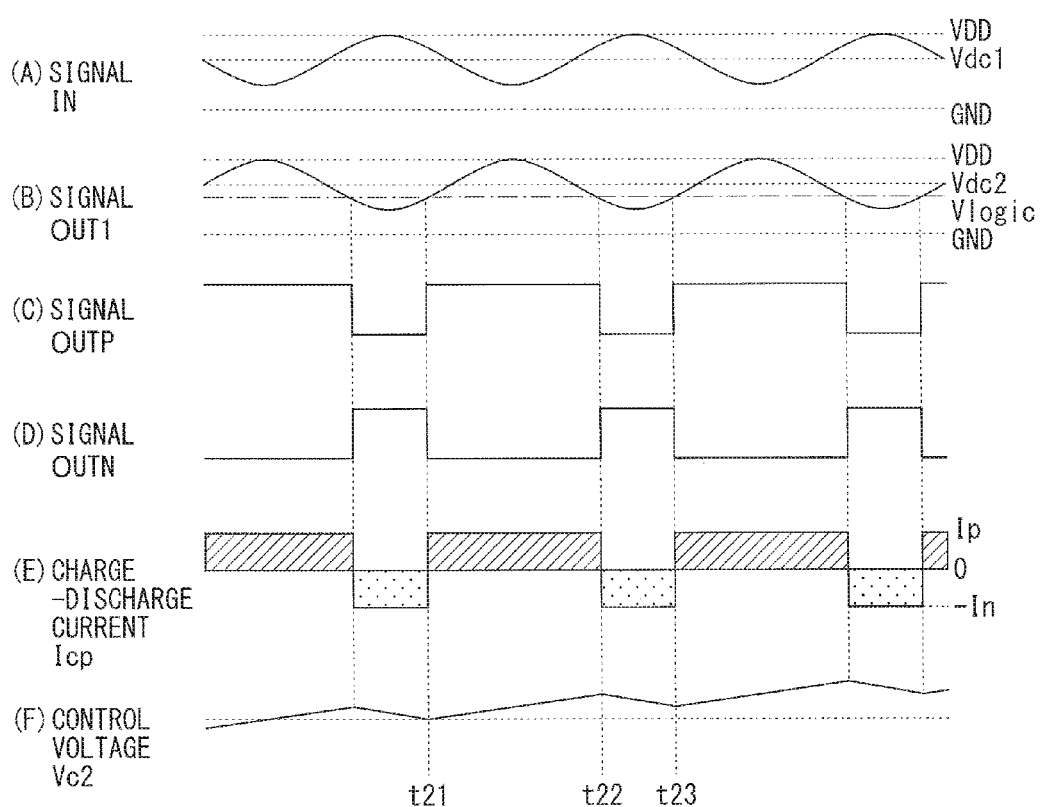
FIG. 8 is a timing waveform chart illustrating an operation example of the duty ratio correction circuit illustrated in FIG. 6.

FIG. 8 illustrates operation when the duty ratio of each of the signals OUTP and OUTN is shifted from about 50%, where (A) illustrates a waveform of the signal IN, (B) illustrates a waveform of the signal OUT1, (C) illustrates a waveform of the signal OUTP, (D) illustrates a waveform of the signal OUTN, (E) illustrates a waveform of the charge-discharge current Icp to the capacitor 36, and (F) illustrates a waveform of the control voltage Vc.

In this example, the signal IN having the DC level Vdc1 that is slightly higher than the voltage half of the source voltage VDD (VDD/2) is supplied from a preceding circuit ((A) of FIG. 8). Then, the buffer circuit 50 generates the signal OUT1 having the DC level Vdc2 that is slightly higher than the voltage half of the source voltage VDD, based on such a signal IN ((B) of FIG. 8). The buffer 23 amplifies the signal OUT1 based on the logical threshold voltage Vlogic, to generate the signal OUTP ((C) of FIG. 8). The inverter 24 inverts and amplifies the signal OUT1 based on the logical threshold voltage Vlogic, to generate the signal OUTN ((D) of FIG. 8). At this time, the duty ratio of the signal OUTP is higher than about 50%, and the duty ratio of the signal OUTN is lower than about 50%.

The transistor P64 is turned on during a period in which the signal OUTN is at low level (for example, a period from a timing t21 to a timing t22), and is turned off during a period in which the signal OUTN is at high level (for example, a period from the timing t22 to a timing t23). Accordingly, the capacitor 36 is charged with the current Ip during the period in which the signal OUTN is at low level (for example, the period from the timing t21 to the timing t22) ((E) of FIG. 8). Moreover, the transistor N65 is turned on during the period in which the signal OUTN is at high level (for example, the period from the timing t22 to the timing t23), and is turned off during the period in which the signal OUTN is at low level (for example, the period from the timing t21 to the timing t22). Accordingly, the capacitor 36 is discharged by the current In during the period in which the signal OUTN is at high level (for example, the period from the timing t22 to the timing t23) ((E) of FIG. 8). At this time, since the period in which the capacitor 36 is charged with the current Ip is longer than the period in which the capacitor 36 is discharged by the current In, the charge amount is larger than the discharge amount in the capacitor 36, and the control voltage Vc gradually increases ((F) of FIG. 8).

The buffer circuit 50 gradually decreases the DC level Vdc2 of the signal OUT1 in response to gradual increase of the control voltage Vc. As a result, the duty ratio of each of the signals OUTP and OUTN gradually changes toward about 50%.

In the above-described example, the case where the DC level Vdc2 of the signal OUT1 is higher than the logical threshold voltage Vlogic of the buffer 23 and the inverter 24 has been described. On the other hand, when the DC level Vdc2 of the signal OUT1 is lower than the logical threshold voltage Vlogic, the duty ratio of the signal OUTP is lower than about 50%, and the duty ratio of the signal OUTN is higher than about 50%. In this case, since the discharge amount is larger than the charge amount in the capacitor 36, the control voltage Vc gradually decreases, and in response thereto, the DC level Vdc2 of the signal OUT1 gradually increases. As a result, the duty ratio of each of the signals OUTP and OUTN gradually changes toward about 50%.

Figure 9:
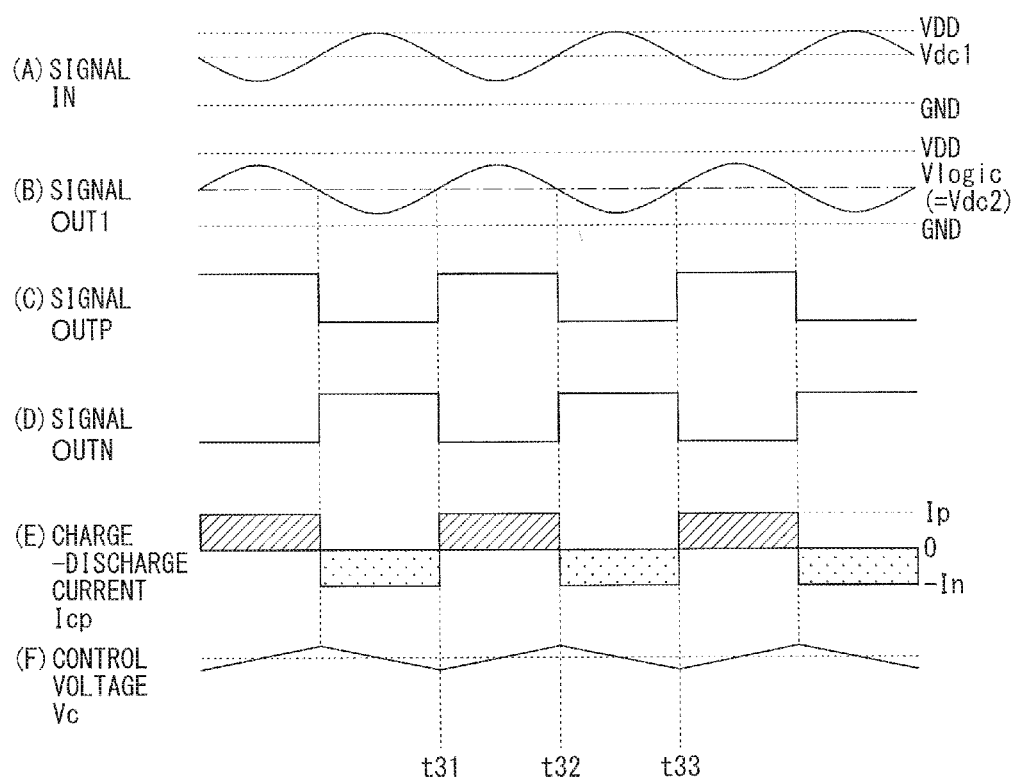
FIG. 9 is a timing waveform chart illustrating another operation example of the duty ratio correction circuit illustrated in FIG. 6.

FIG. 9 illustrates operation when the duty ratio of each of the signals OUTP and OUTN converges on about 50%, where (A) illustrates a waveform of the signal IN, (B) illustrates a waveform of the signal OUT1, (C) illustrates a waveform of the signal OUTP, (D) illustrates a waveform of the signal OUTN, (E) illustrates a waveform of charge-discharge current Icp to the capacitor 36, and (F) illustrates a waveform of the control voltage Vc.

The buffer circuit 50 generates the signal OUT1 having the DC level Vdc2 substantially equivalent to the logical threshold voltage Vlogic, based on the control voltage Vc ((B) of FIG. 9). Then, the buffer 23 and the inverter 24 generate the signals OUTP and OUTN, respectively, based on the signal OUT1 ((C) and (D) of FIG. 9). The transistor P64 is turned on during a period in which the signal OUTN is at low level (for example, a period from a timing t31 to a timing t32), and the capacitor 36 is charged with the current Ip during the period ((E) of FIG. 9). Likewise, the transistor N65 is turned on during a period in which the signal OUTN is at high level (for example, a period from the timing t32 to a timing t33), and the capacitor 36 is discharged by the current In during the period ((E) of FIG. 9). At this time, since the length of the period in which the capacitor 36 is charged with the current Ip is equal to the length of the period in which the capacitor 36 is discharged by the current In, the charge amount and the discharge amount are balanced in the capacitor 36, and the control voltage Vc is maintained ((F) of FIG. 9). In other words, the DC level Vdc2 of the signal OUT1 is set such that the charge amount and the discharge amount are balanced in the capacitor 36. In this way, in the duty ratio correction circuit 2, the duty ratio of each of the signals OUTP and OUTN is allowed to be about 50%.

<2. Second Embodiment>

Next, a duty ratio correction circuit 3 according to a second embodiment is described. In the second embodiment, the negative feedback control is performed so that the current Ip generated by the current source 32 becomes equal to the current In generated by the current source 33, in the duty ratio detection circuit 30 according to the first embodiment. Note that like numerals are used to designate substantially like components of the duty ratio correction circuit 1 according to the above-described first embodiment, and the description thereof is appropriately omitted.

Figure 10:
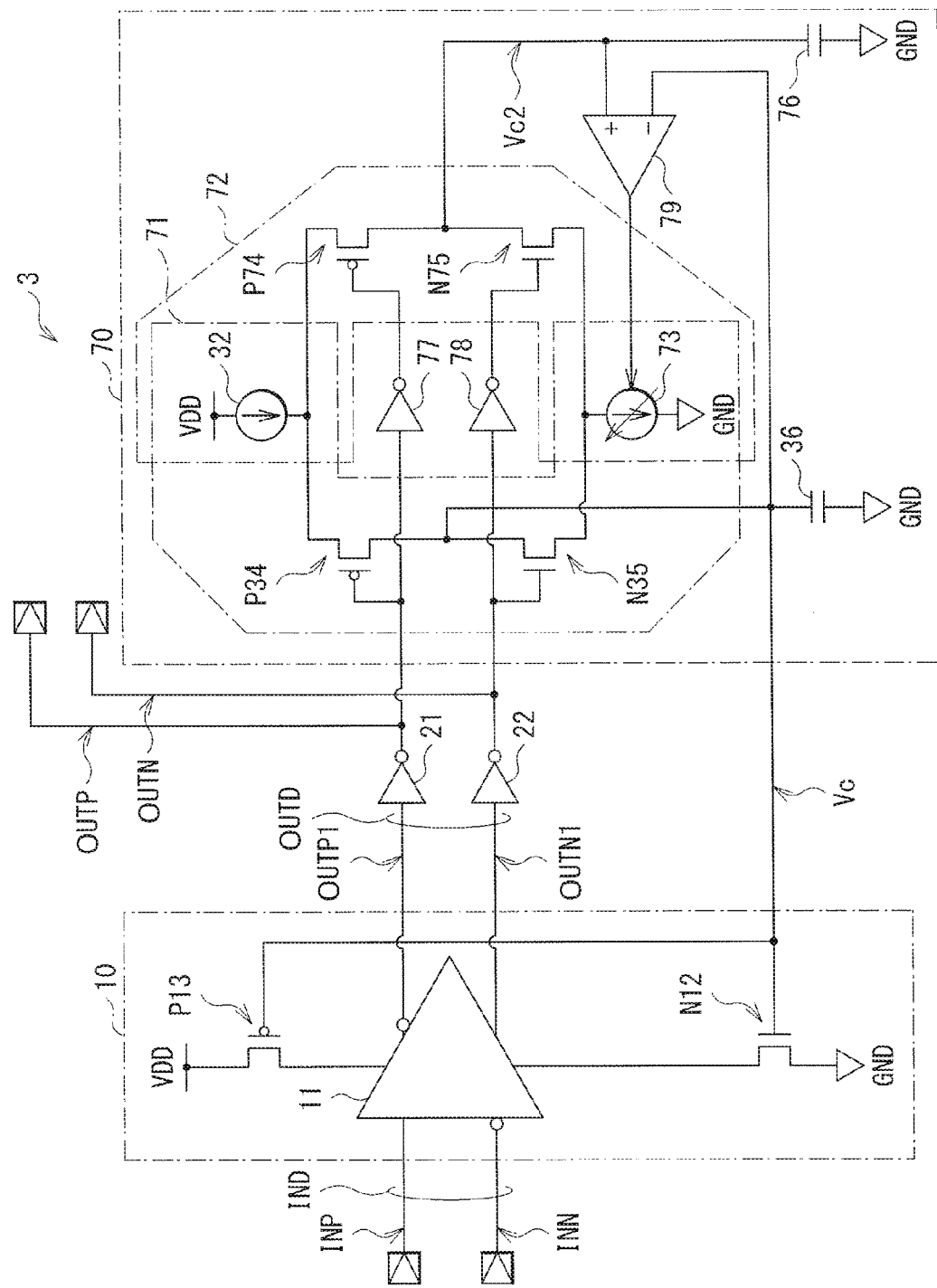
FIG. 10 is a circuit diagram illustrating a configuration example of a duty ratio correction circuit according to a second embodiment.

FIG. 10 illustrates a configuration example of the duty ratio correction circuit 3 according to the second embodiment. The duty ratio correction circuit 3 includes a duty ratio detection circuit 70. The duty ratio detection circuit 70 includes inverters 77 and 78, transistors P74 and N75, a capacitor 76, a differential amplifier 79, and a variable current source 73. The transistors P34 and N35, the current source 32, and the variable current source 73 configure a charge pump 71, and the transistors P74 and N75, the current source 32, and the variable current source 73 configure a charge pump 72. In other words, the charge pump 71 shares the current source 32 and the variable current source 73 with the charge pump 72. Here, the charge pump 71 corresponds to the charge pump 31 according to the first embodiment.

The inverter 77 logically inverts the signal OUTP and outputs the resultant signal. The inverter 78 logically inverts the signal OUTN and outputs the resultant signal.

The transistor P74 is a P-type MOSFET, and the transistor N75 is an N-type MOSFET. A gate of the transistor P74 is connected to an output terminal of the inverter 77, a drain thereof is connected to a drain of the transistor N75, a first end of the capacitor 76, and a positive input terminal of the differential amplifier 79 (described later), and a source thereof is connected to the source of the transistor P34 and the first end of the current source 32. A gate of the transistor N75 is connected to an output terminal of the inverter 78, the drain thereof is connected to the drain of the transistor P74, the first end of the capacitor 76, and the positive input terminal of the differential amplifier 79 (described later), and a source thereof is connected to a first end of the variable current source 73. The first end of the capacitor 76 is connected to the drains of the respective transistors P74 and N75 and the positive input terminal of the differential amplifier 79 (described later), and a second end thereof is grounded.

The differential amplifier 79 is a circuit amplifying a voltage difference between the voltage of the positive input terminal and a voltage of a negative input terminal. The positive input terminal of the differential amplifier 79 is connected to the drains of the respective transistors P74 and N75 and the first end of the capacitor 76, and the negative input terminal is connected to the drains of the respective transistors P34 and N35, the first end of the capacitor 36, and the gates of the respective transistors N12 and P13 of the buffer circuit 10.

The variable current source 73 is a circuit generating the current In that is sunk from the capacitors 36 and 76, and is configured to vary the magnitude of the current In based on an output voltage of the differential amplifier 79. In this example, the variable current source 73 increases the current amount of the current In as the output voltage of the differential amplifier 79 is high. The first end of the variable current source 73 is connected to the sources of the respective transistors N35 and N75, and a second end thereof is grounded.

With this configuration, in the duty ratio correction circuit 3, similarly to the duty ratio correction circuit 1 according to the first embodiment, the negative feedback control is performed so that the duty ratio of each of the signals OUTP and OUTN becomes about 50%. At this time, as will be described later, in the duty ratio detection circuit 70, the negative feedback control is performed so that the current In of the variable current source 73 is equal to the current Ip of the current source 32.

Here, the transistors P74 and N75 correspond to a specific but non-limiting example of "second charge-discharge control circuit" in the disclosure.

Figure 11:
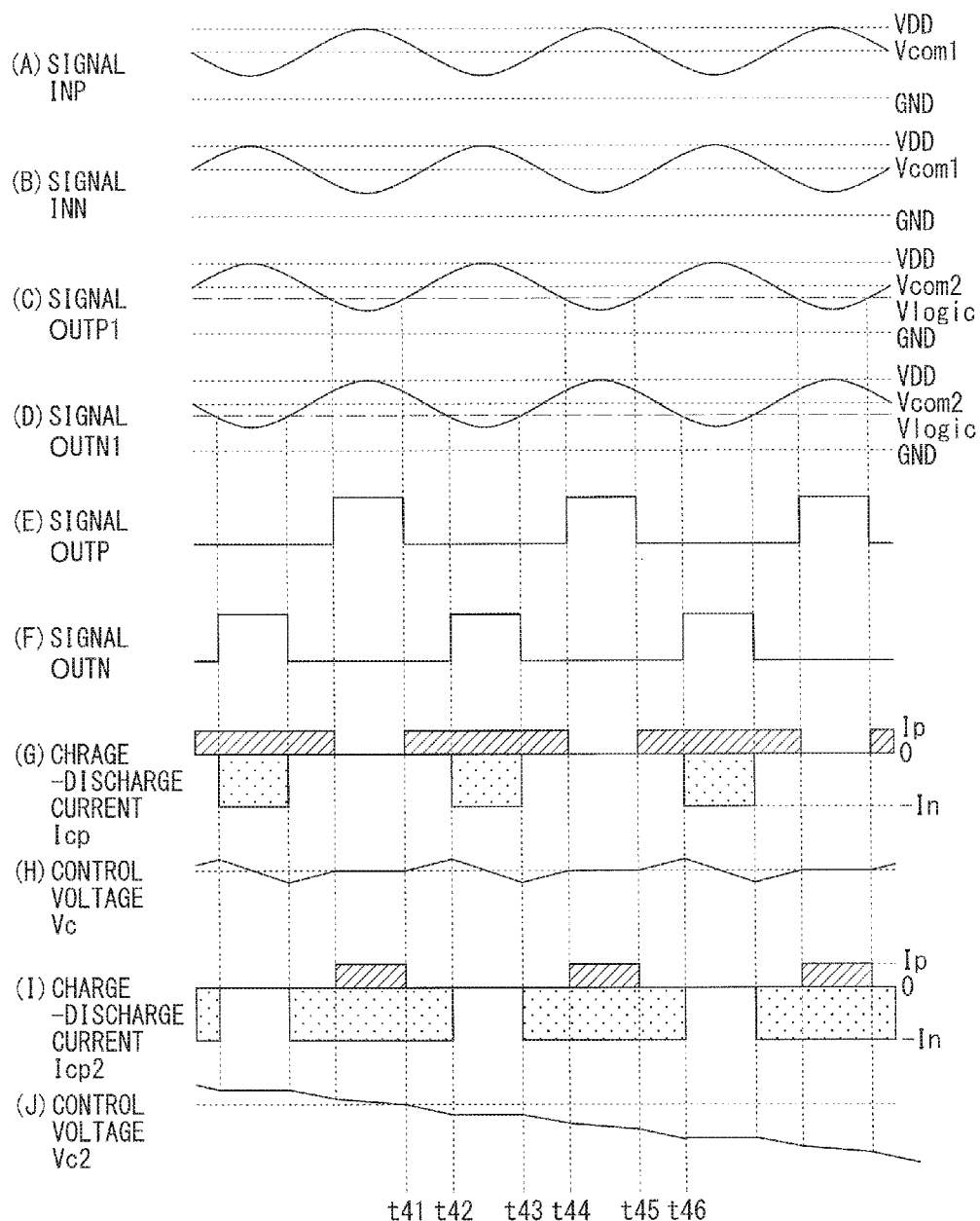
FIG. 11 is a timing waveform chart illustrating an operation example of the duty ratio correction circuit illustrated in FIG. 10.

FIG. 11 illustrates operation when the current In is larger than the current Ip, where (A) illustrates a waveform of the signal INP, (B) illustrates a waveform of the signal INN, (C) illustrates a waveform of the signal OUTP1, (D) illustrates a waveform of the signal OUTN1, (E) illustrates a waveform of the signal OUTP, (F) illustrates a waveform of the signal OUTN, (G) illustrates a waveform of the charge-discharge current Icp to the capacitor 36, (H) illustrates a waveform of the control voltage Vc, (I) illustrates a waveform of a charge-discharge current Icp2 to the capacitor 76, and (J) illustrates a waveform of a control voltage Vc2.

The buffer circuit 10 generates the signals OUTP1 and OUTN1 each having the common mode voltage Vcom2 that is slightly higher than the voltage half of the source voltage VDD (VDD/2), based on the signals INP and INN ((C) and (D) of FIG. 11). Then, the inverters 21 and 22 generate the signals OUTP and OUTN based on the signals OUTP1 and OUTN1, respectively ((E) and (F) of FIG. 11). Accordingly, similarly to the case of the above-described first embodiment (FIG. 3), the duty ratio of each of the signals OUTP and OUTN is lower than about 50%.

In the duty ratio detection circuit 70, when the signal OUTP is at low level, the transistor P34 is turned on and the current source 32 allows the current Ip to flow through the capacitor 36. When the signal OUTP is at high level, the transistor P74 is turned on, and the current source 32 allows the current Ip to flow through the capacitor 76. Moreover, in the duty ratio detection circuit 70, when the signal OUTN is at high level, the transistor N35 is turned on, and the current source 73 sinks the current In from the capacitor 36. When the signal OUTN is at low level, the transistor N75 is turned on, and the current source 73 sinks the current In from the capacitor 76.

Specifically, in the charge pump 71, similarly to the case of the above-described first embodiment, the transistor P34 is turned on during a period in which the signal OUTP is at low level (for example, a period from a timing t41 to a timing t44), and the capacitor 36 is charged with the current Ip during the period ((G) of FIG. 11). Further, similarly to the case of the above-described first embodiment, the transistor N35 is turned on during a period in which the signal OUTN is at high level (for example, a period from a timing t42 to a timing t43), and the capacitor 36 is discharged by the current In during the period ((G) of FIG. 11). At this time, the period in which the capacitor 36 is charged with the current Ip is longer than the period in which the capacitor 36 is discharged by the current In. However, since the current In is larger than the current Ip, the charge amount and the discharge amount are balanced in the capacitor 36, and the control voltage Vc is maintained, in this example ((H) of FIG. 11).

Moreover, in the charge pump 72, the transistor P74 is turned on during a period in which the signal OUTP is at high level (for example, a period from the timing t44 to a timing t45), and the capacitor 76 is charged with the current Ip during the period ((I) of FIG. 11). Further, the transistor N75 is turned on during a period in which the signal OUTN is at low level (for example, a period from the timing t43 to a timing t46), and the capacitor 76 is discharged by the current In during the period ((I) of FIG. 11). At this time, the period in which the capacitor 76 is charged with the current Ip is shorter than the period in which the capacitor 76 is discharged by the current In. In addition, the current Ip is smaller than the current In. Therefore, the discharge amount is larger than the charge amount in the capacitor 76, and thus the control voltage Vc2 gradually decreases ((J) of FIG. 11).

The differential amplifier 79 adjusts the value of the current In of the variable current source 73, based on the voltage difference between the voltage of the first end of the capacitor 76 (the control voltage Vc2) and the voltage of the first end of the capacitor 36 (the control voltage Vc). In other words, in this example, since the control voltage Vc is maintained and the control voltage Vc2 gradually decreases, the output voltage of the differential amplifier 79 gradually decreases and the current In gradually decreases.

In the above-described example, the case where the current In is larger than the current Ip has been described. On the other hand, when the current In is smaller than the current Ip, the control voltage Vc2 gradually increases, and the current In gradually increases accordingly.

In this way, the duty ratio correction circuit 3 controls the current In to be small by making the control voltage Vc2 small when the current In is larger than the current Ip. Moreover, when the current In is smaller than the current Ip, the control is performed to increase the current In by increasing the control voltage Vc2. The current In is controlled to be equal to the current Ip through such negative feedback operation.

Figure 12:
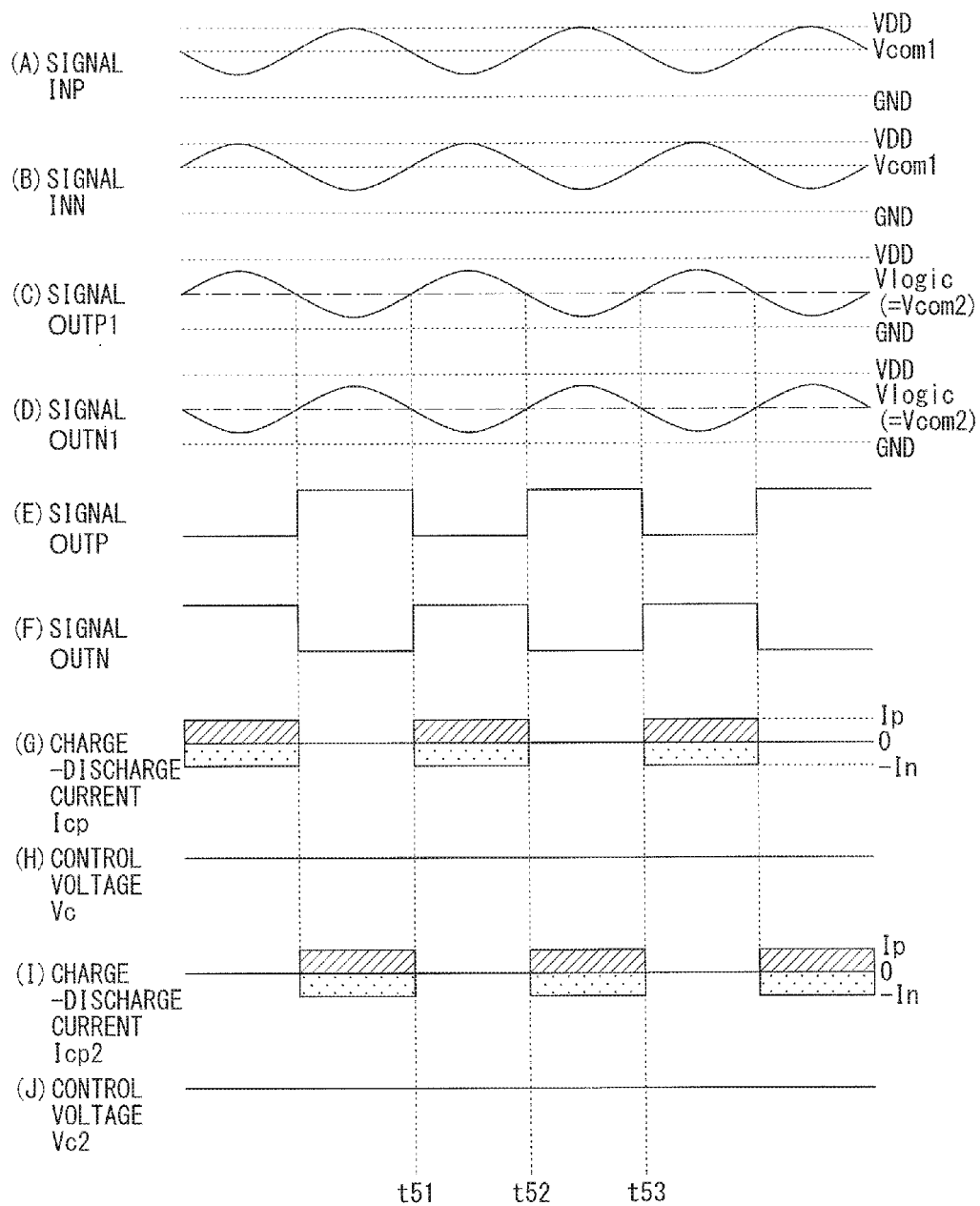
FIG. 12 is a timing waveform chart illustrating another operation example of the duty ratio correction circuit illustrated in FIG. 10.

FIG. 12 illustrates operation when the current In converges on a current value substantially equivalent to the current Ip, where (A) illustrates a waveform of the signal INP, (B) illustrates a waveform of the signal INN, (C) illustrates a waveform of the signal OUTP1, (D) illustrates a waveform of the signal OUTN1, (E) illustrates a waveform of the signal OUTP, (F) illustrates a waveform of the signal OUTN, (G) illustrates a waveform of the charge-discharge current Icp to the capacitor 36, (H) illustrates a waveform of the control voltage Vc, (I) illustrates a waveform of the charge-discharge current Icp2 to the capacitor 76, and (J) illustrates a waveform of the control voltage Vc2.

The buffer circuit 10 generates the signals OUTP1 and OUTN1 each having the common mode voltage Vcom2 substantially equivalent to the logical threshold voltage Vlogic, based on the control voltage Vc ((C) and (D) of FIG. 12). Then, the inverters 21 and 22 generate the signals OUTP and OUTN based on the signals OUTP1 and OUTN1, respectively ((E) and (F) of FIG. 12).

In the charge pump 71, the transistor P34 is turned on during a period in which the signal OUTP is at low level (for example, a period from a timing t51 to a timing t52), and the capacitor 36 is charged with the current Ip during the period ((G) of FIG. 12). Likewise, the transistor N35 is turned on during a period in which the signal OUTN is at high level (for example, the period from the timing t51 to the timing t52), and the capacitor 36 is discharged by the current In during the period ((G) of FIG. 12). At this time, since the length of the period in which the capacitor 36 is charged with the current Ip is equal to the length of the period in which the capacitor 36 is discharged by the current In and the current In is equal to the current Ip, the charge amount and the discharge amount are balanced in the capacitor 36, and thus the control voltage Vc is maintained ((H) of FIG. 12).

Moreover, in the charge pump 72, the transistor P74 is turned on during a period in which the signal OUTP is at high level (for example, a period from the timing t52 to a timing t53), and the capacitor 76 is charged with the current Ip during the period ((I) of FIG. 12). Likewise, the transistor N75 is turned on during a period in which the signal OUTN is at low level (for example, the period from the timing t52 to the timing t53), and the capacitor 76 is discharged by the current In during the period ((I) of FIG. 12). At this time, since the length of the period in which the capacitor 76 is charged with the current Ip is equal to the length of the period in which the capacitor 76 is discharged by the current In and the current In is equal to the current Ip, the charge amount and the discharge amount are balanced in the capacitor 76, and the control voltage Vc is maintained ((J) of FIG. 12).

In this way, in the duty ratio correction circuit 3, the current In of the variable current source 73 and the common mode voltage Vcom2 of the signals OUTP1 and OUTN1 are controlled such that the charge amount and the discharge amount are balanced in the capacitor 36 and the charge amount and the discharge amount are balanced in the capacitor 76. In this way, in the duty ratio correction circuit 3, the duty ratio of each of the signals OUTP and OUTN is allowed to be about 50%.

As described above, in the duty ratio correction circuit 3, the charge pump 72 is further provided to control the current In. Therefore, since the current Ip is allowed to be substantially equal to the current In, it is possible to correct the duty ratio of each of the signals OUTP and OUTN with high accuracy. Specifically, for example, in the configuration equivalent to the duty ratio correction circuit 1 according to the above-described first embodiment, if so-called current mismatch occurs between the current Ip and the current In and the current values thereof are different from each other, the duty ratio of each of the signals OUTP and OUTN may be largely deviated from about 50%, as will be described below.

Figure 13:
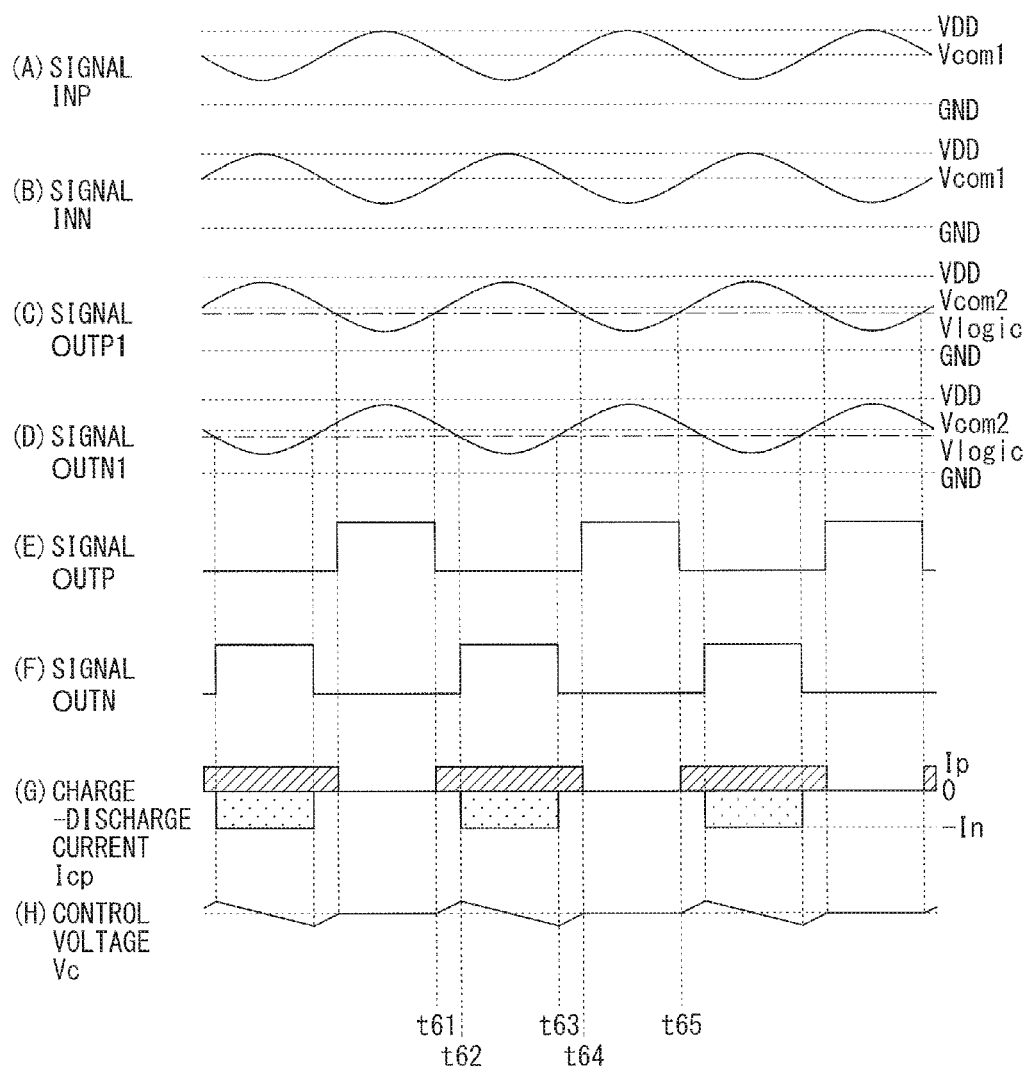
FIG. 13 is a timing waveform chart illustrating an operation example of a duty ratio correction circuit according to a comparative example of the second embodiment.

FIG. 13 illustrates operation when the current mismatch occurs in the duty ratio correction circuit 1, where (A) illustrates a waveform of the signal INP, (B) illustrates a waveform of the signal INN, (C) illustrates a waveform of the signal OUTP1, (D) illustrates a waveform of the signal OUTN1, (E) illustrates a waveform of the signal OUTP, (F) illustrates a waveform of the signal OUTN, (G) illustrates a waveform of the charge-discharge current Icp to the capacitor 36, and (H) illustrates a waveform of the control voltage Vc. FIG. 13 illustrates an example in a case where the current In is larger than the current Ip. In the duty ratio correction circuit 1, the common mode voltage Vcom2 of the signals OUTP1 and OUTN1 is controlled such that the charge amount and the discharge amount are balanced in the capacitor 36. At this time, since the current In is larger than the current Ip, the period in which the current Ip flows (for example, a period from a timing t61 to a timing t64) is longer than the period in which the current In flows (for example, a period from a timing t62 to a timing t63). Therefore, the duty ratio of each of the signals OUTP and OUTN is lower than about 50% as illustrated in (E) and (F) of FIG. 13.

On the other hand, in the duty ratio correction circuit 3, the charge pump 72 is further provided to control the current In. Therefore, since the current Ip and the current In are allowed to be substantially equal to each other, it is possible to suppress deviation of the duty ratio caused by the fact that the current Ip is different from the current In. As a result, in the duty ratio correction circuit 3, it is possible to current the duty ratio of each of the signals OUTP and OUTN with high accuracy.

As described above, in the second embodiment, the charge pump 72 is further provided and the control is performed such that the current In is equal to the current Ip. Therefore, it is possible to correct the duty ratio with high accuracy. Other effects are similar to those in the case of the above-described first embodiment.

(Modification 2-1)

In the above-described embodiment, the buffer circuit 10 handles the differential signal. However, the signal is not limited thereto, and alternatively, for example, similarly to the duty ratio correction circuit 2 according to the modification 1-1, the buffer circuit 10 may handle a single-ended signal. A duty ratio correction circuit 4 according to the present modification will be described in detail below.

Figure 14:
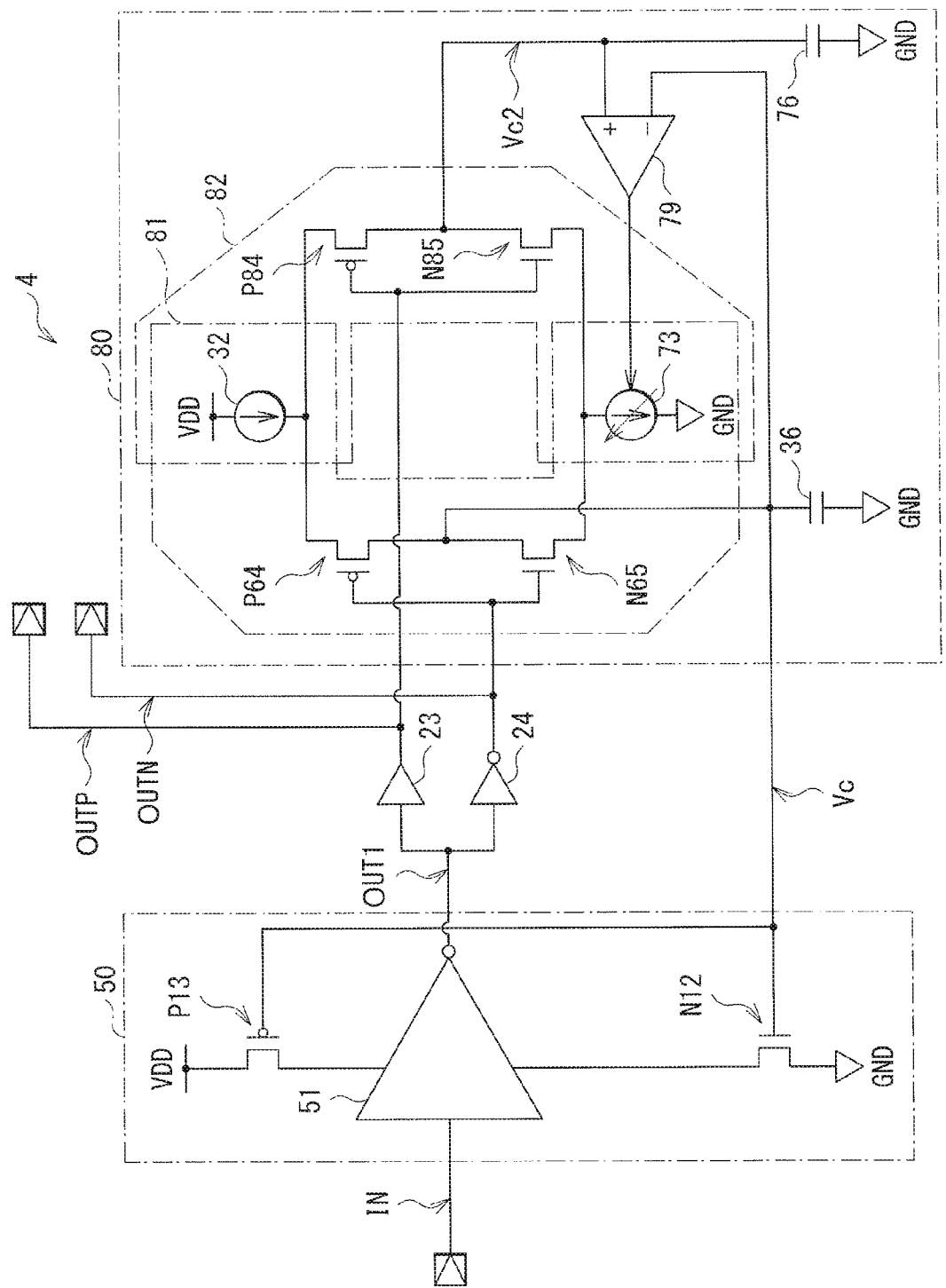
FIG. 14 is a circuit diagram illustrating a configuration example of a duty ratio correction circuit according to a modification of the first embodiment.

FIG. 14 illustrates a configuration example of the duty ratio correction circuit 4. The duty ratio correction circuit 4 includes a duty ratio detection circuit 80. The duty ratio detection circuit 80 includes transistors P84 and N85. The transistors P64 and N55, the current source 32, and the variable current source 73 configure a charge pump 81, and the transistors P84 and N85, the current source 32, and the variable current source 73 configure a charge pump 82. In other words, the charge pump 81 shares the current source 32 and the variable current source 73 with the charge pump 82. Here, the charge pump 81 corresponds to the charge pump 61 according to the modification of the first embodiment. The transistor P84 is a P-type MOSFET, and the transistor N85 is an N-type MOSFET. A gate of the transistor P84 is connected to a gate of the transistor N85 and the output terminal of the buffer 23, a drain thereof is connected to a drain of the transistor N85, the first end of the capacitor 76, and the positive input terminal of the differential amplifier 79, and a source thereof is connected to the source of the transistor P64 and the first end of the current source 32. The gate of the transistor N85 is connected to the gate of the transistor P84 and the output terminal of the buffer 23, the drain thereof is connected to the drain of the transistor P84, the first end of the capacitor 76, and the positive input terminal of the differential amplifier 79, and a source thereof is connected to the first end of the variable current source 73.

With this configuration, in the duty ratio detection circuit 80, when the signal OUTP is at low level, the transistor P84 is turned on, and the current source 32 allows the current Ip to flow through the capacitor 76. Moreover, when the signal OUTP is at high level, the transistor N85 is turned on, and the variable current source 73 sinks the current In from the capacitor 76. Then, the differential amplifier 79 adjusts the value of the current In of the variable current source 73, based on the voltage difference between the voltage (the control voltage Vc2) of the first end of the capacitor 76 and the voltage (the control voltage Vc) of the first end of the capacitor 36.

Here, the buffer 23 and the inverter 24 correspond to a specific but non-limiting example of "waveform shaping section" in the disclosure. The transistors P84 and N85 correspond to a specific but non-limiting example of "second charge-discharge control circuit" in the disclosure.

Figure 15:
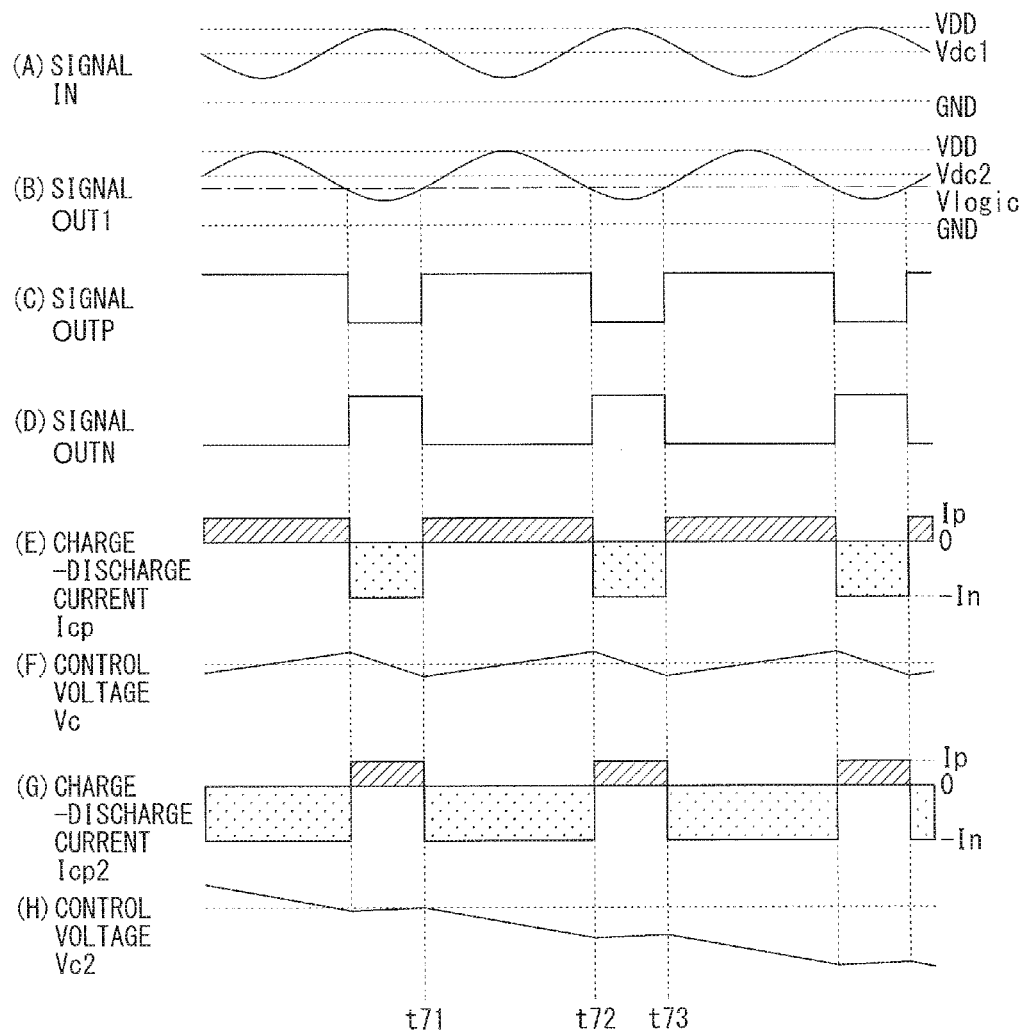
FIG. 15 is a timing waveform chart illustrating an operation example of the duty ratio correction circuit illustrated in FIG. 14.

FIG. 15 illustrates operation when the current In is larger than the current Ip, where (A) illustrates a waveform of the signal IN, (B) illustrates a waveform of the signal OUT1, (C) illustrates a waveform of the signal OUTP, (D) illustrates a waveform of the signal OUTN, (E) illustrates a waveform of the charge-discharge current Icp to the capacitor 36, (F) illustrates a waveform of the control voltage Vc, (G) illustrates a waveform of the charge-discharge current Icp2 to the capacitor 76, and (H) illustrates a waveform of the control voltage Vc2.

The buffer circuit 50 generates the signal OUT1 having the DC level Vdc2 that is slightly higher than the voltage half of the source voltage VDD (VDD/2), based on the signal IN ((B) of FIG. 15). Then, the buffer 23 and the inverter 24 generate the signals OUTP and OUTN, respectively, based on the signal OUT1 ((C) and (D) of FIG. 15). As a result, the duty ratio of the signal OUTP is higher than about 50%, and the duty ratio of the signal OUTN is lower than about 50%.

In the charge pump 81, the transistor P64 is turned on during a period in which the signal OUTN is at low level (for example, a period from a timing t71 to a timing t72), and the capacitor 36 is charged with the current Ip during the period ((E) of FIG. 15). Moreover, the transistor N65 is turned on during a period in which the signal OUTN is at high level (for example, the period from the timing t72 to a timing t73), and the capacitor 36 is discharged by the current In during the period ((E) of FIG. 15). At this time, the period in which the capacitor 36 is charged with the current Ip is longer than the period in which the capacitor 36 is discharged by the current In. However, since the current In is larger than the current Ip, the charge amount and the discharge amount are balanced in the capacitor 36 in this example, and the control voltage Vc is maintained ((F) of FIG. 15).

Moreover, in the charge pump 82, the transistor P84 is turned on during a period in which the signal OUTP is at low level (for example, the period from the timing t72 to the timing t73), and the capacitor 76 is charged with the current Ip during the period ((G) of FIG. 15). Moreover, the transistor N85 is turned on during a period in which the signal OUTP is at high level (for example, the period from the timing t71 to the timing t72), and the capacitor 76 is discharged by the current In during the period ((G) of FIG. 15). At this time, the period in which the capacitor 76 is charged with the current Ip is shorter than the period in which the capacitor 76 is discharged by the current In. Moreover, the current Ip is smaller than the current In. Therefore, since the discharge amount is larger than the charge amount in the capacitor 76, the control voltage Vc2 gradually decreases ((H) of FIG. 15).

The differential amplifier 79 adjusts the value of the current In of the variable current source 73, based on the voltage difference between the voltage of the first end of the capacitor 76 (the control voltage Vc2) and the voltage of the first end of the capacitor 36 (the control voltage Vc). In other words, in this example, since the control voltage Vc is maintained and the control voltage Vc2 gradually decreases, the output voltage of the differential amplifier 79 gradually decreases and the current In gradually decreases.

Figure 16:
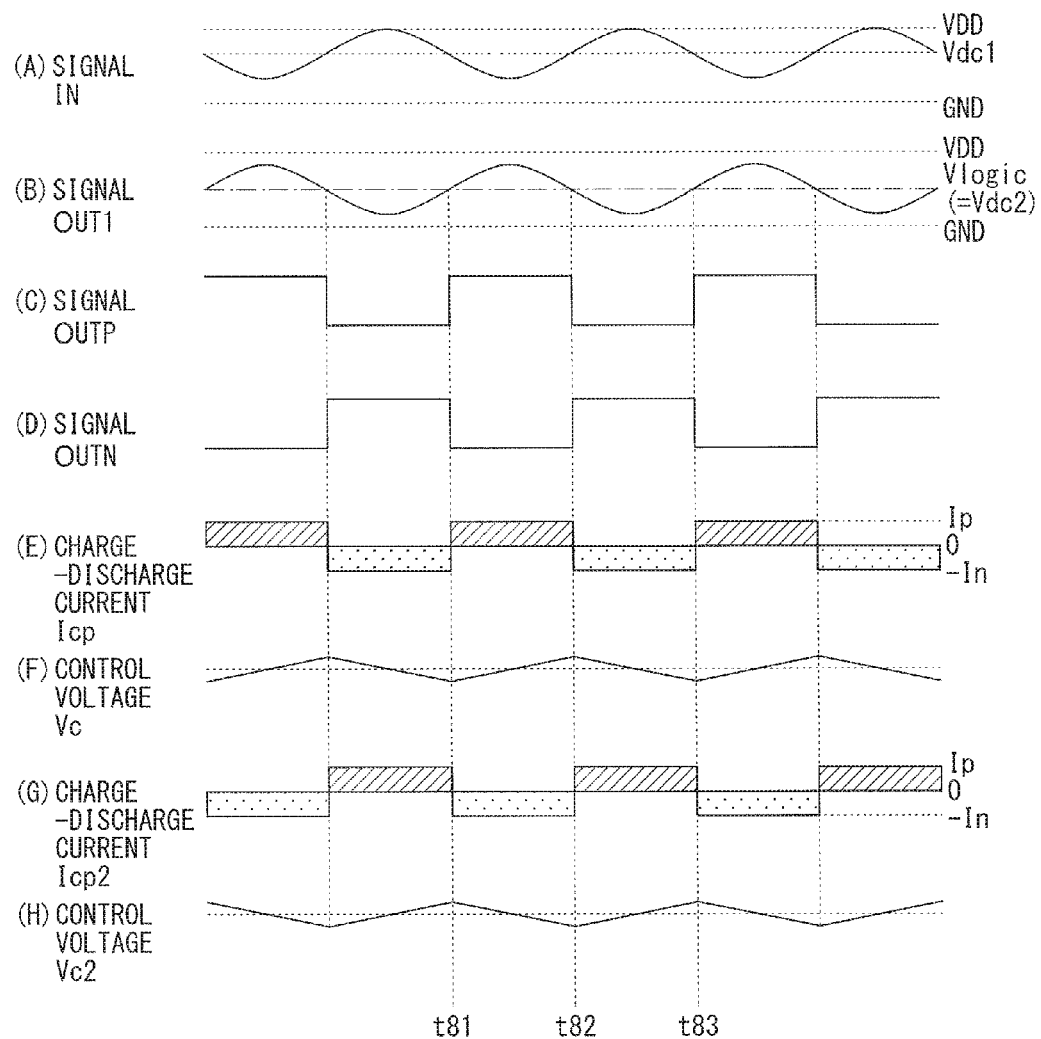
FIG. 16 is a timing waveform chart illustrating another operation example of the duty ratio correction circuit illustrated in FIG. 14.

FIG. 16 illustrates operation when the current In converges on the current value substantially equivalent to the current Ip, where (A) illustrates a waveform of the signal IN, (B) illustrates a waveform of the signal OUT1, (C) illustrates a waveform of the signal OUTP, (D) illustrates a waveform of the signal OUTN, (E) illustrates a waveform of the charge-discharge current Icp to the capacitor 36, (F) illustrates a waveform of the control voltage Vc, (G) illustrates a waveform of the charge-discharge current Icp2 to the capacitor 76, and (H) illustrates a waveform of the control voltage Vc2.

The buffer circuit 50 generates the signal OUT1 that has the DC level Vdc2 substantially equivalent to the logical threshold voltage Vlogic, based on the control voltage Vc ((B) of FIG. 16). Then, the buffer 23 and the inverter 24 generate the signals OUTP and OUTN, respectively, based on the signal OUT1 ((C) and (D) of FIG. 16).

In the charge pump 81, the transistor P64 is turned on during a period in which the signal OUTN is at low level (for example, a period from a timing t81 to a timing t82), and the capacitor 36 is charged with the current Ip during the period ((E) of FIG. 16). Likewise, the transistor N65 is turned on during a period in which the signal OUTN is at high level (for example, a period from the timing t82 to a timing t83), and the capacitor 36 is discharged by the current In during the period ((E) of FIG. 16). At this time, the length of the period in which the capacitor 36 is charged with the current Ip is equal to the length of the period in which the capacitor 36 is discharged by the current In, and the current In is equivalent to the current Ip. Therefore, the charge amount and the discharge amount are balanced in the capacitor 36 and the control voltage Vc is maintained ((F) of FIG. 16).

Moreover, in the charge pump 82, the transistor P84 is turned on during a period in which the signal OUTP is at low level (for example, the period from the timing t82 to the timing t83), and the capacitor 76 is charged with the current Ip during the period ((G) of FIG. 16). Likewise, the transistor N85 is turned on during a period in which the signal OUTP is at high level (for example, the period from the timing t81 to the timing t82), and the capacitor 76 is discharged by the current In during the period ((G) of FIG. 16). At this time, the length of the period in which the capacitor 76 is charged with the current Ip is equal to the length of the period in which the capacitor 76 is discharged by the current In, and the current In is equal to the current Ip. Therefore, the charge amount and the discharge amount are balanced in the capacitor 76, and the control voltage Vc is maintained ((H) of FIG. 16).

As described above, in the duty ratio correction circuit 4, the current In of the variable current source 73 and the DC level Vdc2 of the signal OUT1 are set such that the charge amount and the discharge amount are balanced in the capacitor 36 and the charge amount and the discharge amount are balanced in the capacitor 76. In this way, in the duty ratio correction circuit 4, the duty ratio of each of the signals OUTP and OUTN is allowed to be about 50%.

<3. Application Examples>

Next, application examples of the duty ratio correction circuit described in the above-described embodiments and modifications will be described.

Figure 17:
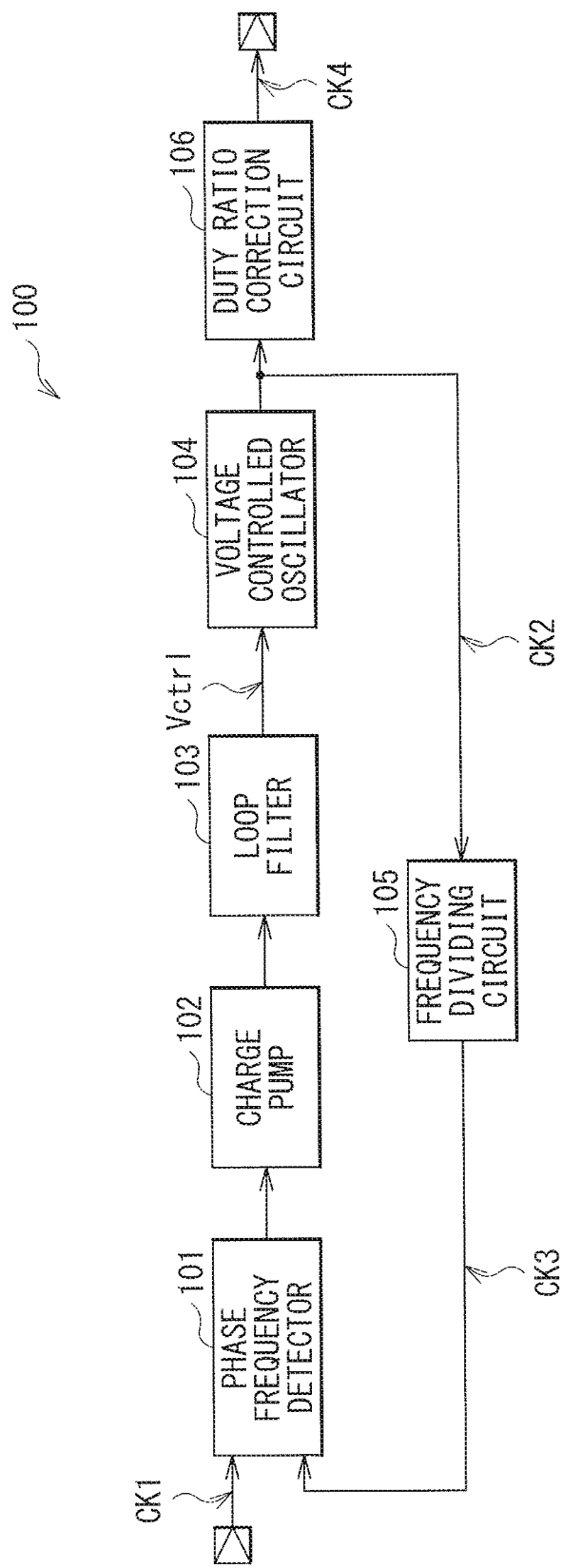
FIG. 17 is a block diagram illustrating a configuration example of a phase synchronization circuit according to an application example of the duty ratio correction circuit according to any of the embodiments.

FIG. 17 illustrates a configuration example of a phase synchronization circuit 100 to which the duty ratio correction circuit according to any of the above-described embodiments and the like is applied. The phase synchronization circuit 100 includes a phase frequency detector (PFD) 101, a charge pump 102, a loop filter 103, a voltage controlled oscillator 104, a frequency dividing circuit 105, and a duty ratio correction circuit 106. The phase frequency detector 101 compares a phase of a clock signal CK1 with a phase of a clock signal CK3, and outputs a comparison result. The charge pump 102 allows a current to flow through the loop filter 103 or sinks the current from the loop filter 103, based on the comparison result supplied from the phase frequency detector 101. The loop filter 103 converts a current signal supplied from the charge pump 102 into a voltage signal while filtering, to generate a voltage Vctrl. The voltage controlled oscillator 104 generates a clock signal CK2 of a frequency corresponding to the voltage Vctrl. The frequency dividing circuit 105 divides the frequency of the clock signal CK2 at a predetermined dividing ratio to generate the clock signal CK3. The duty ratio correction circuit 106 corrects the duty ratio of the clock signal CK2 to generate a clock signal CK4. The duty ratio correction circuit 106 is configured of any of the duty ratio correction circuits 1 to 4 and the like according to the above-described embodiment and the like.

In this example, any of the duty ratio correction circuits 1 to 4 and the like is applied to the phase synchronization circuit 100; however, this is not limited thereto, and any of the duty ratio correction circuits 1 to 4 and the like may be applied to various applications in which correction of the duty ratio of the signal is necessary. Specifically, for example, this may be applied to an application such as clock data recovery.

Hereinbefore, the present technology has been described with reference to some embodiments, the modifications, and the application examples; however, the present technology is not limited to the embodiments and the like, and various modifications may be made.

Figure 18:
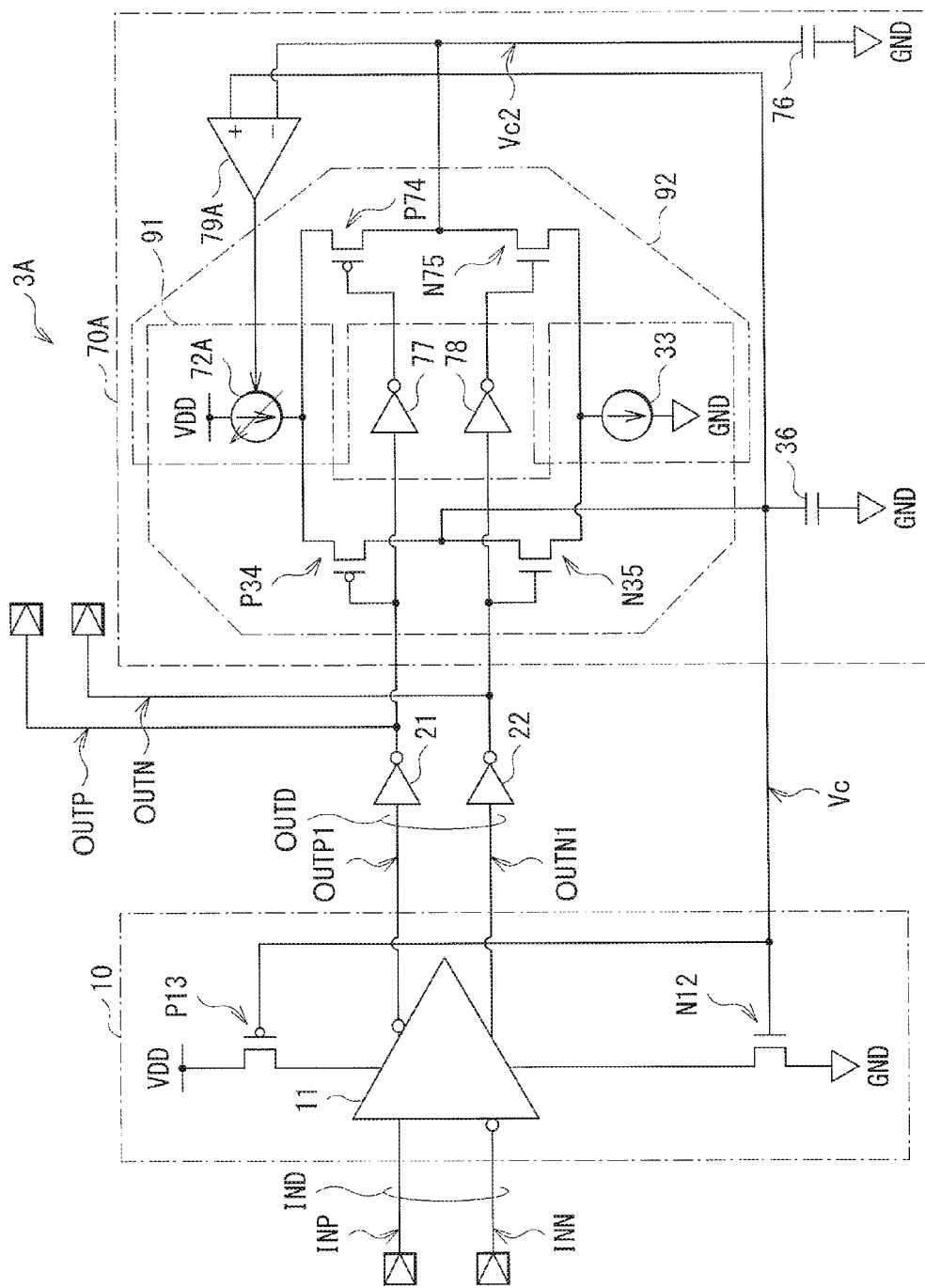
FIG. 18 is a circuit diagram illustrating a configuration example of a duty ratio correction circuit according to a modification.

For example, in the duty ratio correction circuits 3 and 4 according to the above-described second embodiment, the control is performed so as to allow the current In to be equal to the current Ip. However, this is not limited thereto, and alternatively, for example, as with a duty ratio correction circuit 3A illustrated in FIG. 18, control is performed so as to allow the current Ip to be equal to the current In. The duty ratio correction circuit 3A includes a duty ratio detection circuit 70A. The duty ratio detection circuit 70A includes a differential amplifier 79A and a variable current source 72A. The transistors P34 and N35, the variable current source 72A, and the current source 33 configure a charge pump 91, and the transistor P74 and N75, the variable current source 72A, and the current source 33 configure a charge pump 92. A positive input terminal of the differential amplifier 79A is connected to the drains of the respective transistors P34 and N35, the first end of the capacitor 36, and the gates of the respective transistors N12 and P13 of the buffer circuit 10. A negative input terminal of the differential amplifier 79A is connected to the drains of the respective transistors P74 and N75 and the first end of the capacitor 76. The variable current source 72A is a circuit generating the current Ip that is allowed to flow through the capacitors 36 and 76, and is configured to vary the magnitude of the current Ip based on the output voltage of the differential amplifier 79A. In this example, the variable current source 72A increases the amount of the current Ip as the output voltage of the differential amplifier 79A is high. A first end of the variable current source 72A is connected to the sources of the respective transistors P34 and P74, and a second end thereof is supplied with the source voltage VDD. In the duty ratio correction circuit 3A, when the current Ip is smaller than the current In, the control is performed so as to increase the current Ip by decreasing the control voltage Vc2. In addition, when the current Ip is larger than the current In, the control is performed so as to decrease the current Ip by increasing the control voltage Vc2. The current Ip is controlled to be equal to the current In by such negative feedback operation.

Note that the effects described in the present specification are illustrative and non-limiting. Effects achieved by the technology may be effects other than those described above.

Note that the present technology may be configured as follows.

(1) A duty ratio correction circuit including:
  a buffer circuit configured to generate a second signal based on a first signal, the second signal having a DC component corresponding to a first control signal;
  a waveform shaping section configured to shape a waveform of the second signal to generate a third signal that is a target of duty ratio correction;
  a first capacitor; and
  a first charge-discharge control circuit configured to selectively charge or discharge the first capacitor based on the third signal, to generate the first control signal.

(2) The duty ratio correction circuit according to (1), further including:
  a first current source; and
  a second current source, wherein
  the first charge-discharge control circuit charges the first capacitor with a current of the first current source, and discharges the first capacitor by a current of the second current source.

(3) The duty ratio correction circuit according to (2), further including:
  a second capacitor; and
  a second charge-discharge control circuit configured to selectively charge or discharge the second capacitor based on the third signal, to generate a second control signal, wherein
  the first current source or the second current source is a variable current source having a current value varied based on a signal difference between the first control signal and the second control signal.

(4) The duty ratio correction circuit according to (3), wherein the second charge-discharge control circuit charges the second capacitor with a current of the first current source and discharges the second capacitor by a current of the second current source.

(5) The duty ratio correction circuit according to (3) or (4), wherein
the second signal is formed of a first polarity signal and a second polarity signal,
the waveform shaping section includes
a first waveform shaping section configured to shape a waveform of the first polarity signal to generate a third polarity signal that is a target of the duty ratio correction, and
a second waveform shaping section configured to shape a waveform of the second polarity signal to generate a fourth polarity signal that is a target of the duty ratio correction, and
the first charge-discharge control circuit includes
a first transistor configured to connect or disconnect a connection between the first current source and the first capacitor, based on the third polarity signal, and
a second transistor configured to connect or disconnect a connection between the second current source and the first capacitor, based on the fourth polarity signal.

(6) The duty ratio correction circuit according to (3) or (4), wherein the first charge-discharge control circuit includes
a first transistor configured to connect or disconnect a connection between the first current source and the first capacitor, based on the third signal, and
a second transistor configured to connect or disconnect a connection between the second current source and the first capacitor, based on the third signal.

(7) The duty ratio correction circuit according to (5) or (6), wherein the second charge-discharge control circuit includes
a third transistor interposed between the first current source and the second capacitor, the third transistor being put into a connection state during a period in which the first transistor is put into a disconnection state, and
a fourth transistor interposed between the second current source and the second capacitor, the fourth transistor being put into a connection state during a period in which the second transistor is put into a disconnection state.

(8) A phase synchronization circuit including:
a phase comparison circuit configured to compare a phase of an input clock signal with a phase of a feedback clock signal;
an oscillation circuit configured to generate a first signal based on a comparison result of the phase comparison circuit;
a frequency dividing circuit configured to divide a frequency of the first signal to generate the feedback clock signal; and
a duty ratio correction circuit configured to operate based on the first signal, wherein
the duty ratio correction circuit includes
a buffer circuit configured to generate a second signal based on the first signal, the second signal having a DC component corresponding to a first control signal,
a waveform shaping section configured to shape a waveform of the second signal to generate a third signal that is a target of duty ratio correction,
a first capacitor, and
a first charge-discharge control circuit configured to selectively charge or discharge the first capacitor based on the third signal, to generate the first control signal.

It should be understood by those skilled in the art that various modifications, combinations, sub-combinations, and alterations may occur depending on design requirements and other factors insofar as they are within the scope of the appended claims or the equivalents thereof.

What is claimed is:

1. A duty ratio correction circuit comprising:
a buffer circuit configured to generate a second signal based on a first signal, the second signal having a DC component corresponding to a first control signal;
a waveform shaping section configured to shape a waveform of the second signal to generate a third signal that is a target of duty ratio correction;
a first capacitor; and
a first charge-discharge control circuit configured to selectively charge or discharge the first capacitor based on the third signal, to generate the first control signal.

2. The duty ratio correction circuit according to claim 1, further comprising:
a first current source; and
a second current source, wherein
the first charge-discharge control circuit charges the first capacitor with a current of the first current source, and discharges the first capacitor by a current of the second current source.

3. The duty ratio correction circuit according to claim 2, further comprising:
a second capacitor; and
a second charge-discharge control circuit configured to selectively charge or discharge the second capacitor based on the third signal, to generate a second control signal, wherein
the first current source or the second current source is a variable current source having a current value varied based on a signal difference between the first control signal and the second control signal.

4. The duty ratio correction circuit according to claim 3, wherein the second charge-discharge control circuit charges the second capacitor with a current of the first current source and discharges the second capacitor by a current of the second current source.

5. The duty ratio correction circuit according to claim 3, wherein the second signal is formed of a first polarity signal and a second polarity signal, the waveform shaping section includes
a first waveform shaping section configured to shape a waveform of the first polarity signal to generate a third polarity signal that is a target of the duty ratio correction, and
a second waveform shaping section configured to shape a waveform of the second polarity signal to generate a fourth polarity signal that is a target of the duty ratio correction, and
the first charge-discharge control circuit includes
a first transistor configured to connect or disconnect a connection between the first current source and the first capacitor, based on the third polarity signal, and
a second transistor configured to connect or disconnect a connection between the second current source and the first capacitor, based on the fourth polarity signal.

6. The duty ratio correction circuit according to claim 3, wherein the first charge-discharge control circuit includes
a first transistor configured to connect or disconnect a connection between the first current source and the first capacitor, based on the third signal, and
a second transistor configured to connect or disconnect a connection between the second current source and the first capacitor, based on the third signal.

7. The duty ratio correction circuit according to claim 5, wherein the second charge-discharge control circuit includes a third transistor interposed between the first current source and the second capacitor, the third transistor being put into a connection state during a period in which the first transistor is put into a disconnection state, and a fourth transistor interposed between the second current source and the second capacitor, the fourth transistor being put into a connection state during a period in which the second transistor is put into a disconnection state.

8. A phase synchronization circuit comprising:

a phase comparison circuit configured to compare a phase of an input clock signal with a phase of a feedback clock signal;

an oscillation circuit configured to generate a first signal based on a comparison result of the phase comparison circuit;

a frequency dividing circuit configured to divide a frequency of the first signal to generate the feedback clock signal; and a duty ratio correction circuit configured to operate based on the first signal, wherein the duty ratio correction circuit includes a buffer circuit configured to generate a second signal based on the first signal, the second signal having a DC component corresponding to a first control signal, a waveform shaping section configured to shape a waveform of the second signal to generate a third signal that is a target of duty ratio correction, a first capacitor, and a first charge-discharge control circuit configured to selectively charge or discharge the first capacitor based on the third signal, to generate the first control signal.

* * * * *